US011114160B2

United States Patent
Gangasani et al.

(10) Patent No.: US 11,114,160 B2
(45) Date of Patent: Sep. 7, 2021

(54) MEMORY DEVICE FOR COMPENSATING FOR CURRENT OF OFF CELLS AND OPERATING METHOD THEREOF

(71) Applicant: SAMSUNG ELECTRONICS CO., LTD., Suwon-si (KR)

(72) Inventors: Venkataramana Gangasani, Suwon-si (KR); Moo-Sung Kim, Yongin-si (KR); Tae-Hui Na, Seoul (KR); Jun-Ho Shin, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/034,254

(22) Filed: Sep. 28, 2020

(65) Prior Publication Data

US 2021/0012837 A1 Jan. 14, 2021

Related U.S. Application Data

(62) Division of application No. 16/430,657, filed on Jun. 4, 2019, now Pat. No. 10,825,517.

(30) Foreign Application Priority Data

Jun. 12, 2018 (KR) .......................... 10-2018-0067565

(51) Int. Cl.
*G11C 13/00* (2006.01)

(52) U.S. Cl.
CPC .......... *G11C 13/004* (2013.01); *G11C 13/003* (2013.01); *G11C 13/0004* (2013.01); *G11C 13/0026* (2013.01); *G11C 13/0028* (2013.01); *G11C 13/0033* (2013.01); *G11C 13/0038* (2013.01); *G11C 2213/15* (2013.01); *G11C 2213/72* (2013.01)

(58) Field of Classification Search
CPC .............. G11C 13/004; G11C 13/0004; G11C 13/0026; G11C 13/0028; G11C 13/003; G11C 13/0033; G11C 13/0038; G11C 2213/15; G11C 2213/72
USPC ....................................................... 365/163
See application file for complete search history.

(56) References Cited

U.S. PATENT DOCUMENTS 6,343,039 B2   1/2002  Agawa et al.
6,856,555 B2   2/2005  Fujimoto
(Continued)

FOREIGN PATENT DOCUMENTS

CN     106356090 A     1/2017

*Primary Examiner* — Son L Mai
(74) *Attorney, Agent, or Firm* — Volentine, Whitt & Francos, PLLC

(57) ABSTRACT

A memory device includes a memory cell array including a plurality of memory cells arranged at points where a plurality of word lines and a plurality of bit lines intersect; a sense amplifier configured to amplify, in a read operation mode of the memory device, a voltage difference value between a voltage of a selected word line connected to a selected memory cell of the plurality of memory cells and a reference voltage; and a leakage current compensation circuit connected to a selected word line path between the selected memory cell and the sense amplifier and configured to compensate for a total leakage current generated by unselected memory cells connected to the selected word line in the read operation mode.

19 Claims, 29 Drawing Sheets

(56) References Cited

U.S. PATENT DOCUMENTS

| | | | |
|---|---|---|---|
| 7,245,526 B2 * | 7/2007 | Oh | G11C 7/12 |
| | | | 365/163 |
| 7,248,494 B2 | 7/2007 | Oh et al. | |
| 7,304,884 B2 | 12/2007 | Sugahara | |
| 8,259,515 B2 | 9/2012 | Bedeschi et al. | |
| 8,427,862 B2 | 4/2013 | Parkinson | |
| 8,830,724 B2 | 9/2014 | Chang | |
| 8,908,426 B2 | 12/2014 | Wang et al. | |
| 9,142,271 B1 | 9/2015 | Srinivasan et al. | |
| 10,475,510 B2 | 11/2019 | Yang et al. | |
| 10,825,517 B2 * | 11/2020 | Gangasani | G11C 13/004 |
| 2016/0125937 A1 | 5/2016 | Kang | |
| 2016/0372193 A1 | 12/2016 | Kripanidhi et al. | |

* cited by examiner

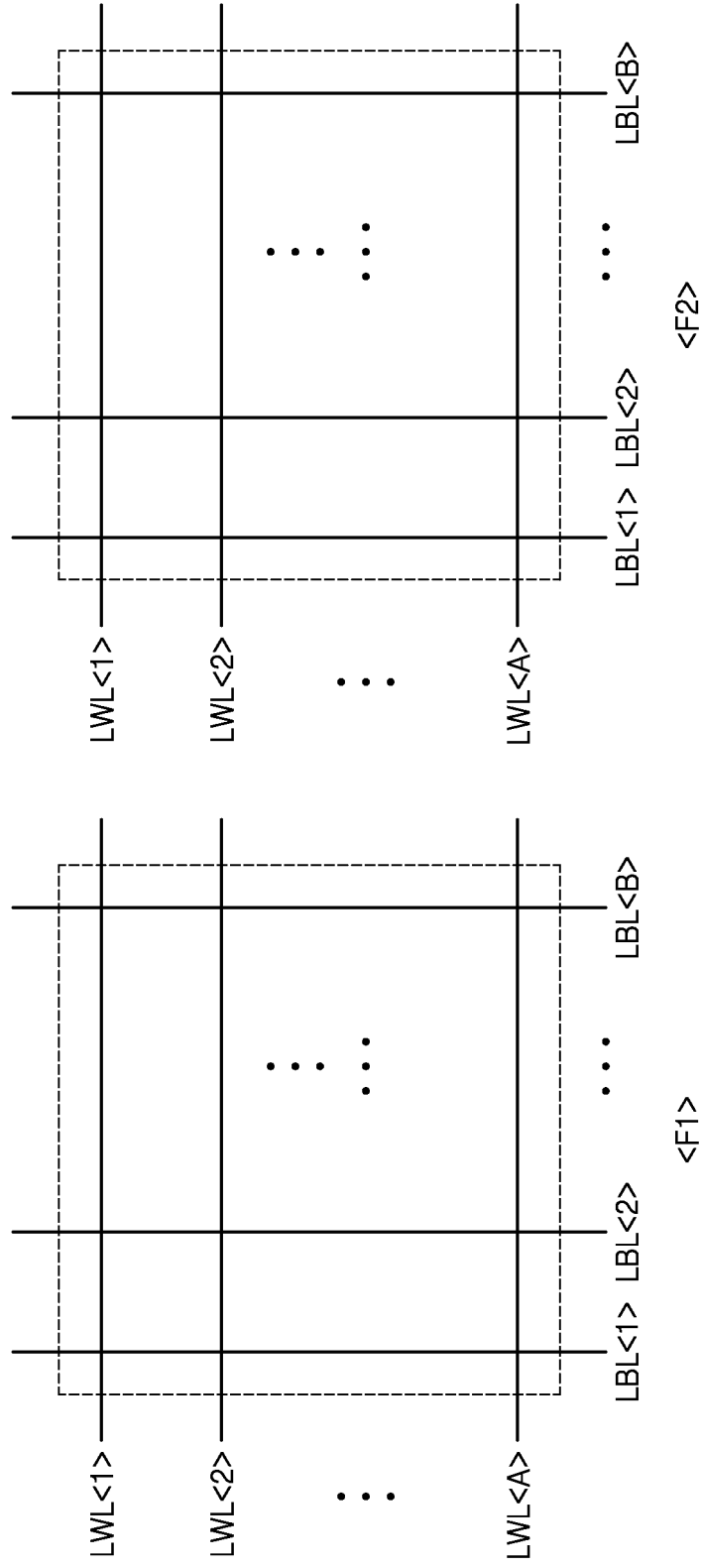

MEMORY DEVICE FOR COMPENSATING FOR CURRENT OF OFF CELLS AND OPERATING METHOD THEREOF

CROSS-REFERENCE TO RELATED APPLICATION

This is a Divisional of U.S. application Ser. No. 16/430,657, filed Jun. 4, 2019, and a claim of priority under 35 U.S.C. § 119 is made to Korean Patent Application No. 10-2018-0067565, filed on Jun. 12, 2018, in the Korean Intellectual Property Office, the entireties of which are incorporated herein by reference.

BACKGROUND

The present disclosure relates to memory devices, and more particularly to resistive memory devices and a method of operating resistive memory devices that compensates for currents of off cells in a read operation mode.

As the need for high capacity memory devices having low power consumption has increased, research has focused on next generation memory devices that are nonvolatile and do not require refreshing. Such next generation memory devices are required to have for example the high integration of dynamic random access memory (DRAM), the non-volatility of flash memory, and the high performance of static RAM (SRAM). Next generation memory devices such as phase change RAM (PRAM), nano-floating gate memory (NFGM), polymer RAM (PoRAM), magnetic RAM (MRAM), ferroelectric RAM (FeRAM), and the like have drawn interest as meeting the above-mentioned requirements.

One of the important challenges for improving the performance of memory devices is to improve the reliability of a read operation by improving read operation performance of memory devices. Various methods have been considered to improve read operation performance of memory devices.

SUMMARY

Embodiments of the inventive concepts relate to resistive memory devices and provide a method and apparatus for improving the reliability of a read operation by reducing a read error of a memory device.

Embodiments of the inventive concepts provide a memory device including a memory cell array including a plurality of memory cells arranged at points where a plurality of word lines and a plurality of bit lines intersect; a sense amplifier configured to amplify, in a read operation mode of the memory device, a voltage difference value between a voltage of a selected word line connected to a selected memory cell of the plurality of memory cells and a reference voltage; and a leakage current compensation circuit connected to a selected word line path from the selected memory cell to the sense amplifier, and configured to compensate for a total leakage current generated by unselected memory cells connected to the selected word line in the read operation mode.

Embodiments of the inventive concepts further provide a memory device including a memory cell array including a plurality of memory cells connected to intersections of a plurality of local bit lines connected to a plurality of global word lines, and a plurality of local bit lines connected to a plurality of global bit lines; a local word line select transistor disposed on a selected local word line from among the plurality of local word lines, the selected local word line coupled to a selected memory cell of the plurality of memory cells, the local word line select transistor configured to selectively form an electrical flow path between the selected memory cell and a selected global word line from among the plurality of global word lines; and a leakage current compensation circuit coupled to the local word line select transistor and configured to compensate for a first current value representing a sum of leakage currents generated by unselected memory cells coupled to the selected local word line, in a read operation mode of the memory device.

Embodiments of the inventive concepts still further provide a memory device including a memory cell array including a plurality of memory cells coupled to intersections of a plurality of local word lines coupled to a plurality of global word lines, and a plurality of local bit lines coupled to a plurality of global bit lines; a global word line select transistor disposed on a selected global word line from among the plurality of global word lines, the selected global word line connected to a selected local word line from among the plurality of local word lines, the selected local word line connected to a selected memory cell of the plurality of memory cells, the global word line select transistor configured to selectively form an electrical flow path between the selected local word line and a read/write circuit of the memory device; and a leakage current compensation circuit coupled to the global word line select transistor and configured to compensate for a first current value generated by off cells from among the plurality of memory cells in a read operation mode of the memory device, the off cells connected to the selected local word line of the plurality of memory cells.

Embodiments of the inventive concepts also provide a memory device including a plurality of tiles. Each of the plurality of tiles include a memory cell array including a plurality of memory cells connected to intersections between a plurality of word lines and a plurality of bit lines; a sense amplifier configured to amplify a voltage difference value between a voltage of a selected word line of the plurality of word lines and a reference voltage, in a read operation mode of the memory device, the selected word line coupled to a selected memory cell of the plurality of memory cells; a discharge transistor connected to one end of the sense amplifier and configured to discharge a charge of the selected word line in the read operation mode of the memory device; and a leakage current compensation circuit coupled to the discharge transistor and configured to compensate for a first current value generated by off cells of the plurality of memory cells in the read operation mode of the memory device, the off cells connected to the selected word line.

Embodiments of the inventive concepts additionally provide a memory device including a first transistor disposed in an electrical path between a selected memory cell of a plurality of memory cells and a read/write circuit of the memory device; and a leakage current compensation circuit including a second transistor connected to a gate of the first transistor and having characteristics that are the same as characteristics of the first transistor. The leakage current compensation circuit is configured to cause a current having a same magnitude as a leakage current generated by unselected memory cells connected to a selected word line to which the selected memory cell is connected to flow through the first transistor, in a read operation mode of the memory device that reads data from the selected memory cell.

BRIEF DESCRIPTION OF THE DRAWINGS

Embodiments of the inventive concepts will be more clearly understood from the following detailed description taken in conjunction with the accompanying drawings in which:

FIGS. 2A, 2B, 2C and 2D illustrate structure of a memory device according to an example embodiment of the inventive concepts;

DETAILED DESCRIPTION OF THE EMBODIMENTS

Embodiments of the inventive concepts will be described as follows in detail with reference to accompanying drawings.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
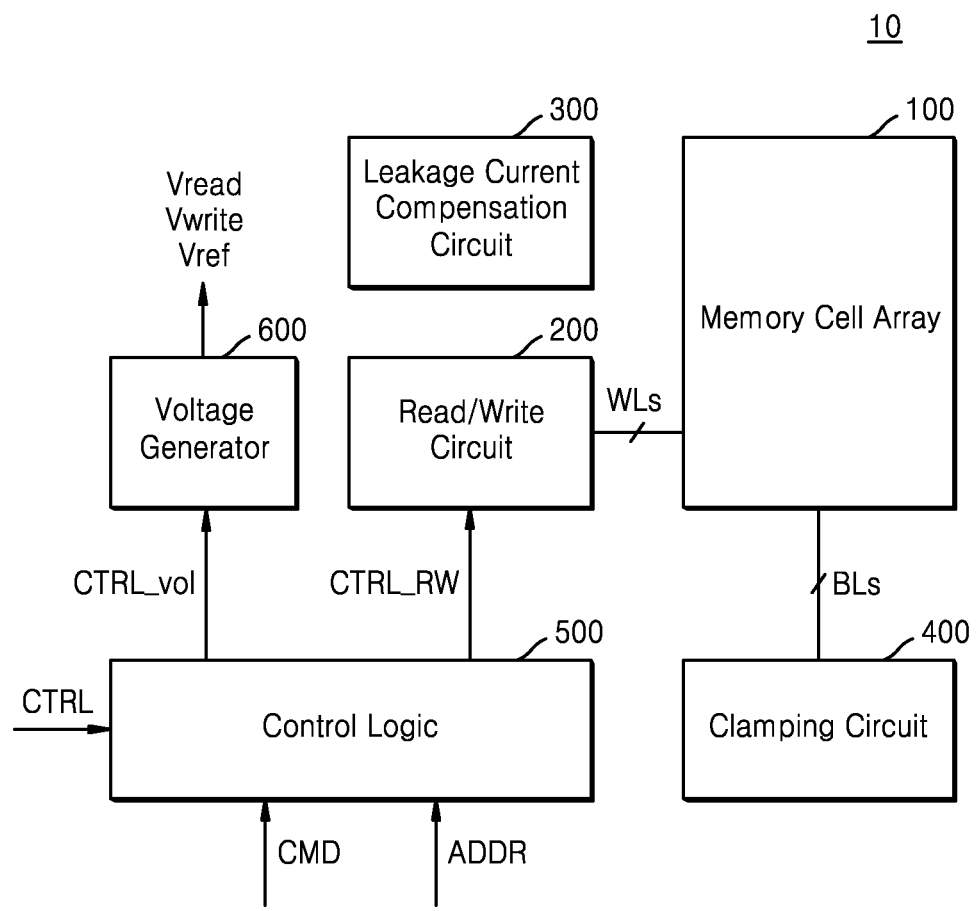
FIG. 1 illustrates a block diagram of a memory device 10 according to an embodiment of the inventive concepts.

FIG. 1 illustrates a block diagram of a memory device 10 according to an embodiment of the inventive concepts. The memory device 10 includes a memory cell array 100, a read/write circuit 200, a leakage current compensation circuit 300, a clamping circuit 400, a control logic 500 (which may be characterized as a controller), and a voltage generator 600.

The memory cell array 100 may include a plurality of memory cells respectively arranged in regions where a plurality of first signal lines and a plurality of second signal lines cross each other. In an example embodiment, the plurality of first signal lines may be a plurality of word lines (WLs), and the plurality of second signal lines may be a plurality of bit lines (BLs). In another example embodiment, the plurality of first signal lines may be a plurality of bit lines, and the plurality of second signal lines may be a plurality of word lines. The memory device 10 including such a memory cell array 100 may be referred to as a cross-point memory device.

In an example embodiment, each of the plurality of word lines may include a global word line and at least one local word line. For example, one word line may include a global word line and at least one local word line electrically connected to the global word line through a local word line select transistor.

In addition, in an example embodiment, each of the plurality of bit lines may include a global bit line and at least one local bit line. For example, one bit line may include a global bit line and at least one local bit line electrically connected to the global bit line through a local bit line select transistor.

In example embodiments of the inventive concepts, the plurality of memory cells may include resistive memory cells including a variable resistive element. For example, when the variable resistive element is a phase change material and a resistance thereof varies with temperature, the memory device 10 may be phase-change random access memory (PRAM). In this case, the phase change material may include various kinds of materials such as for example GaSb, InSb, InSe, $Sb_2Te_3$, GeTe each including two combined elements, GeSbTe, GaSeTe, InSbTe, $SnSb_2Te_4$, InSbGe each including three combined elements, and AgInSbTe, (GeSn) SbTe, GeSb (SeTe), $Te_{81}Ge_{15}Sb_2S_2$ each including four combined elements. In another example, when the variable resistive element is formed of an upper electrode, a lower electrode, and a complex metal oxide therebetween, the memory device 10 may be resistive random access memory (RRAM). Accordingly, the memory device 10 may be referred to as a resistive memory device.

Although not illustrated in FIG. 1, in an embodiment, the memory device 10 may include a row decoder and/or a column decoder. The row decoder may perform a word line selection operation in response to a row address provided from the control logic 500 and the column decoder may perform a bit line select operation in response to a column address provided from the control logic 500.

The read/write circuit 200 is connected to the memory cell array 100 through the first signal lines and/or the second signal lines to write or read data to/from the memory cells. In an example embodiment, the read/write circuit 200 may be coupled to a plurality of word lines to perform operations to write or read data, responsive to a read/write control signal CTRL_RW provided from control logic 500. In an embodiment, the read/write circuit 200 may be coupled to a selected word line via a row decoder. In addition, in an embodiment, the read/write circuit 200 may include a read circuit and a write circuit.

In the following description, in embodiments of the inventive concepts, when the memory device 10 performs an operation of reading data through the read/write circuit 200, the memory device 10 should be understood as under a data read operation mode. Furthermore, the selected memory cell may mean a memory cell in which a write, read, and/or erase operation, etc. among a plurality of memory cells is performed. The write operation, the read operation, and the erase operation of the memory device 10 may be referred to as a data operation. In addition, in the following description, an unselected memory cell may refer to a memory cell other than the selected memory cell among memory cells. In addition, in the following description, the selected word line may mean a word line to which a selected memory cell among a plurality of word lines is connected, and the selected bit line may refer to a bit line to which a selected memory cell among a plurality of bit lines is connected.

The leakage current compensation circuit 300 compensates for a first current value indicating a sum of leakage current values flowing in unselected memory cells connected to the selected word line, wherein the selected word line is connected to the selected memory cell, in the read operation mode of the memory device 10. To this end, the leakage current compensation circuit 300 may be connected to an electrical path from the selected memory cell to the read/write circuit 200 (i.e., to an electrical path that connects the selected memory cell to the read/write circuit 200). In an example embodiment, the leakage current compensation circuit 300 may be coupled to a local word line select transistor LX. This example embodiment will be described in more detail with reference to FIGS. 8A to 9. Moreover, in an example embodiment, the leakage current compensation circuit 300 may be coupled to a global word line select transistor. This example embodiment will be described in more detail with reference to FIGS. 10A to 11B. In addition, in an example embodiment, the leakage current compensation circuit 300 may be coupled to a discharge transistor coupled to one end of a sense amplifier. This example embodiment will be described in more detail with reference to FIGS. 12A and 12B.

The clamping circuit 400 is connected to the memory cell array 100 through a plurality of bit lines. The clamping circuit 400 may precharge a selected bit line coupled to a selected memory cell in a data read operation mode of the memory device 10. In an embodiment, the clamping circuit 400 may be coupled to the selected bit line via a column decoder.

The control logic 500 may write data to the memory cell array 100 based on a command CMD, an address ADDR and a control signal CTRL received from an external component (e.g., memory controller) of the memory device 10. Alternatively, the control logic 500 may generate various internal control signals for reading data from the memory cell array 100. The control logic 500 may provide the read/write control signal CTRL_RW to the read/write circuit 200. That is, the control logic 500 may control various kinds of operations in the memory device 10 overall. In an embodiment according to the inventive concepts, a series of control operations performed by the memory device 10 may be performed by the control logic 500.

The voltage generator 600 may generate a write voltage Vwrite used for a write operation and a read voltage Vread used for a read operation. The write voltage Vwrite and the read voltage Vread may be provided to global bit lines and local bit lines, or may be provided to global word lines and local word lines. The voltage generator 600 may generate a reference voltage Vref provided to a sense amplifier included in the read/write circuit 200 and may also generate a clamp voltage provided to the clamping circuit 400. The voltage generator 600 may generate the write voltage Vwrite, the read voltage Vread and the reference voltage Vref responsive to the voltage control signal CTRL_vol provided from the control logic 500.

As the degree of integration of the memory device 10 increases, the number of bit lines crossing one word line may increase. As the number of bit lines increases, the number of unselected memory cells associated with the selected word line may increase. Thus, even when the amount of leakage current flowing through each of the unselected memory cells is small, a first current value indicating the total amount of leakage current generated by the plurality of unselected memory cells may reach a level that affects the reliability of the data operation of the memory device 10. For example, the leakage current due to the unselected memory cells may decrease a sensing margin by increasing a potential level of a word line as shown in FIG. 7B, as will be subsequently described.

According to an example embodiment of the inventive concepts, the memory device 10 may be configured such that, in a read operation mode, the leakage current compensation circuit 300 compensates for leakage currents caused by unselected cells, thereby making it possible to widely secure a read window and a sensing margin. The memory device 10 may reduce reading errors by widely ensuring a reading window and a sensing margin, thereby improving the reliability of the reading operation.

The following figures, including FIG. 1, illustrate embodiments in which the read/write circuit 200 is connected to the memory cell array 100 through word lines WLs. However, according to other embodiments, the read/write circuit 200 may be connected to the memory cell array 100 through the bit lines BLs. In this case, the technical idea according to the inventive concepts may be equally applied, except that the signal lines connected to the read/write circuit 200 are not the word lines WLs but bit lines BLs. For example, when the read/write circuit 200 is connected to the memory cell array 100 via the bit lines BLs, the leakage current compensation circuit 300 may be connected to an electrical path on a bit line from the selected memory cell to the read/write circuit 200.

FIGS. 2A, 2B, 2C and 2D illustrate structure of a memory device 10 according to an example embodiment of the inventive concepts.

Figure 2A:
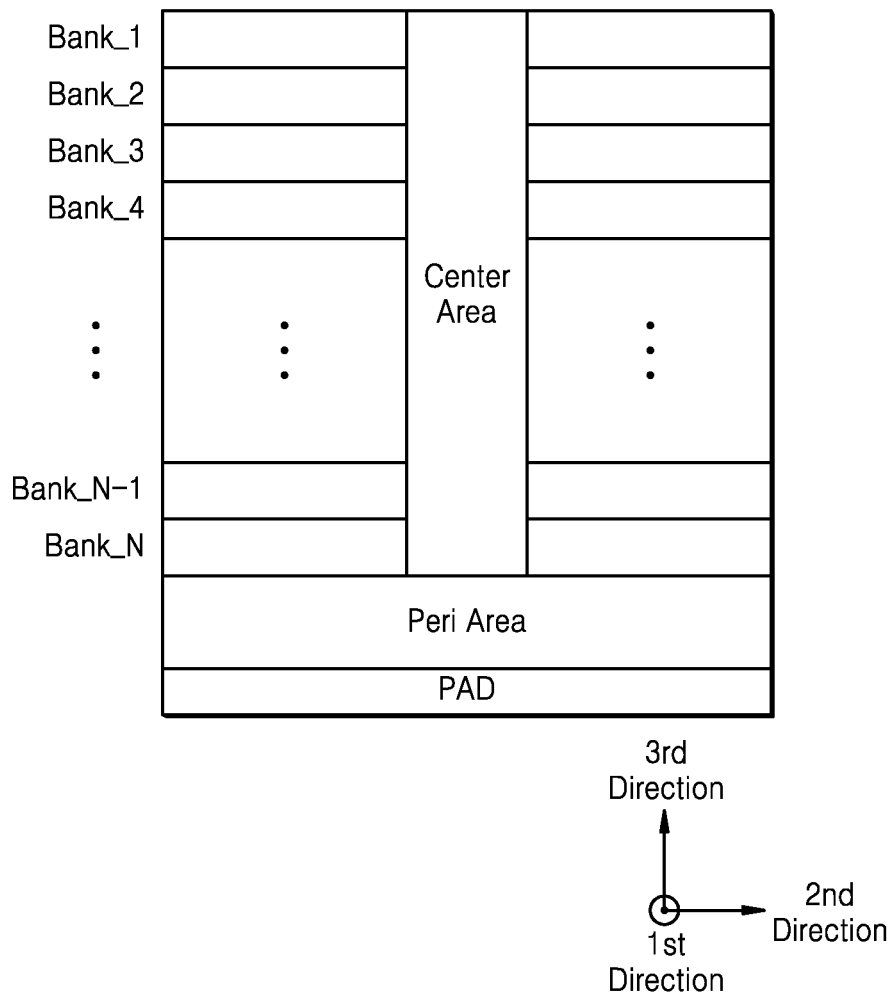

Referring to FIG. 2A, the memory device 10 may have a cell-on-peri (COP) or cell-over-peri (COP) structure in which a memory cell array and peripheral circuits are arranged in a stacking direction (i.e., a third direction).

The memory device 10 may include a pad, a peri area, a center area, and a plurality of memory banks. The peri area may be stacked in the third direction on a pad, and the plurality of memory banks may be stacked in the third direction on the peri area.

A pad may provide an electrical connection to outside of the memory device 10, and the peri area may include various peripheral circuits for operation of the memory device 10. A center area transfers electrical signals generated from peripheral circuits of a peri area to memory cells. In an embodiment, the leakage current compensation circuit 300 of FIG. 1 may be included in the center area.

Each of a first memory bank Bank_1 to an Nth memory bank Bank_N (where N is a natural number) may include two memory cell regions divided on the basis of the center area.

Figure 2B:
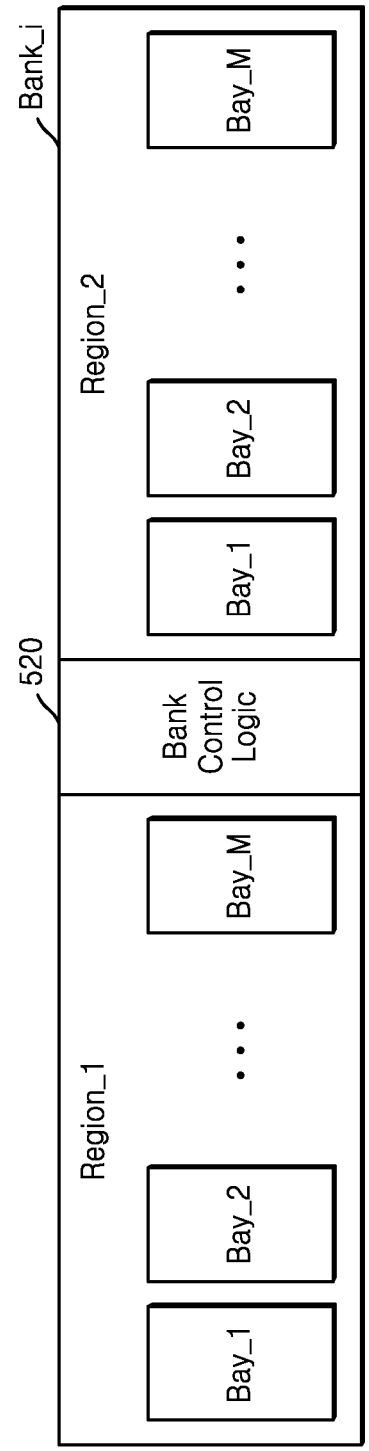

FIG. 2B shows a memory bank Bank_i according to an example embodiment of the inventive concepts. The memory bank Bank_i of FIG. 2B may illustratively represent one of the first to Nth memory banks Bank_1 to Bank_N of FIG. 2A. The memory bank Bank_i may include a first region Region_1, a second region Region_2, and a bank control logic 520. In an embodiment, each of the first region Region_1 and the second region Region_2 may represent a half memory bank, and the bank control logic 520 may be included in the center area of FIG. 2A.

Each of the first and second regions Region_1 and Region_2 may include a plurality of memory bays. For example, each of the first and second regions Region_1 and Region_2 may include first to Mth memory bays Bay_1 to Bay_M (where M is a natural number).

The bank control logic 520 may perform various control operations related to data operations of the memory cell arrays included in the memory bank Bank_i. In an embodiment, the bank control logic 520 may be implemented as a configuration included in control logic 500 of FIG. 1.

Figure 2C:
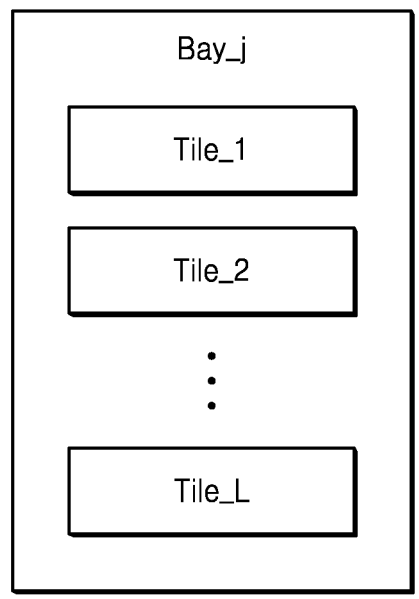

FIG. 2C shows a memory bay Bay_j according to an example embodiment of the inventive concepts. The memory bay Bay_j of FIG. 2C may illustratively be one of the first to Mth memory bays Bay_1 to Bay_M of FIG. 2B.

The memory bay Bay_j may include a plurality of tiles. For example, the memory bay Bay_j may include a first tile Tile_1 to an Lth tile Tile_L (where L is a natural number).

FIG. 2D illustrates a tile according to an example embodiment of the inventive concepts. The tile of FIG. 2D may illustratively be one the first to Lth tiles Tile_1 to Tile_L of FIG. 2C.

The tile may be a resistive memory having a three-dimensional structure including a plurality of layers. For example, the tile may include a first layer F1 and a second layer F2. Each of the first layer F1 and the second layer F2 may include a memory cell array including memory cells located in a region where a plurality of word lines and a plurality of bit lines intersect.

Referring to FIGS. 2A to 2D, a memory bank, a memory bay, and a tile are illustrated as units constituting the memory device 10, but the technical idea according to the inventive concepts are not limited as described with respect to FIGS. 2A to 2D.

Figure 3A:
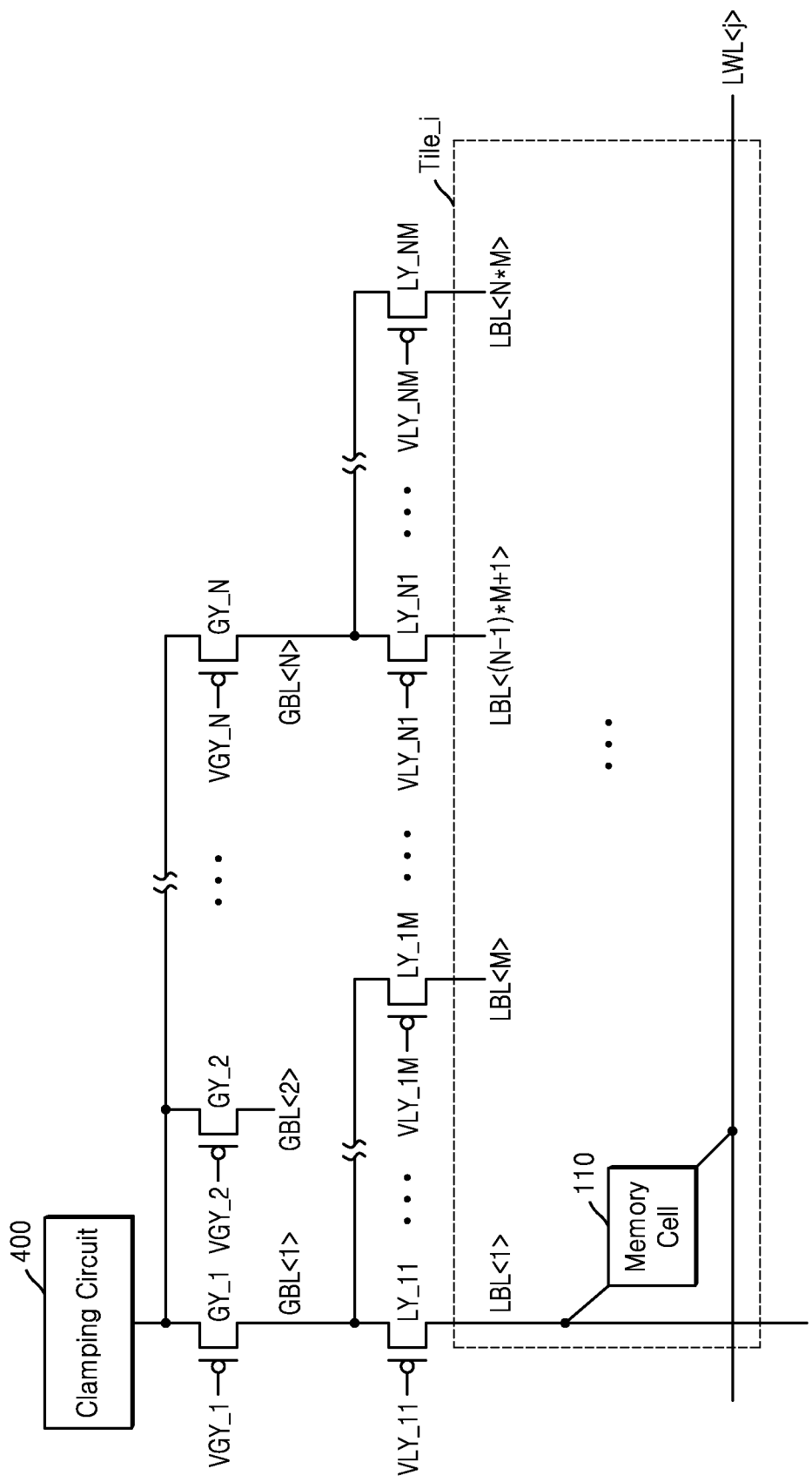
FIG. 3A illustrates a bit line connection structure of a memory cell array according to an example embodiment of the inventive concepts.

FIG. 3A illustrates a bit line connection structure of a memory cell array according to an example embodiment of the inventive concepts. Particularly, FIG. 3A shows a structure in which a tile Tile_i and the clamping circuit 400 are connected through a plurality of bit lines. Referring to FIG. 3A, in an embodiment, each of a plurality of bit lines may include a global bit line and at least one local bit line.

The clamping circuit 400 may be connected to first to Nth global bit lines GBL <1> to GBL <N> (where N is a natural number and is a number different from N in FIG. 2A). The first global bit line GBL <1> may be coupled to the clamping circuit 400 via a first global bit line select transistor GY_1, and the first global bit line select transistor GY_1 may selectively form an electrical flow path between the first global bit line GBL <1> and the clamping circuit 400 based on the first global bit line select signal VGY_1. The above connection structure of the first global bit line GBL <1> may be applied to second to Nth global bit lines GBL <2> to GBL <N>, the global bit line select transistors GY_2 to GY_N, and the global bit line select signals VGY_2 to VGY_N, using the same method thereof.

In the same manner, each of the first to Nth global bit lines GBL <1> to GBL <N> may be connected to M (where M is a natural number and is a number independent from M in FIG. 2B) local bit lines LBL<1> to LBL<N*M>, respectively, by the local bit line select transistors LY_11 to LY_1M, to LY_N1 to LY_NM based on the local bit line select signals VLY_11 to VLY_1M, to VLY_N1 to VLY_NM.

A tile Tile_i may include memory cells such as memory cell 110 arranged in regions where N*M local bit lines and local word lines (e.g., LWL<j>) intersect.

Figure 3B:
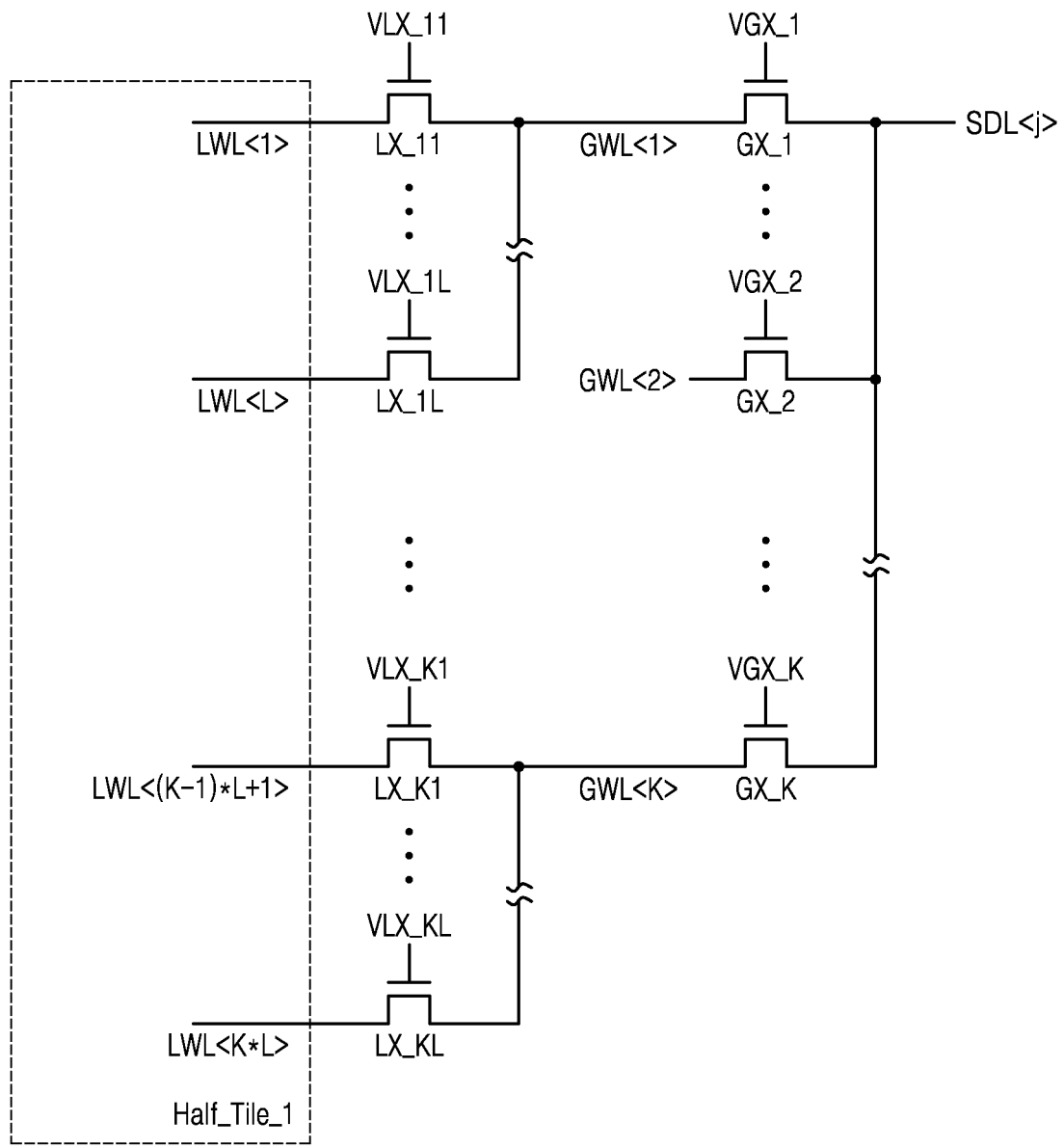
FIG. 3B illustrates a word line connection structure of the memory cell array according to an example embodiment of the inventive concepts.

FIG. 3B illustrates a word line connection structure of a memory cell array according to an example embodiment of the inventive concepts. Particularly, FIG. 3B shows a structure in which one half tile Half_Tile_1 and a data selection line SDL <j> are connected through a plurality of word lines. Referring to FIG. 3B, in an embodiment, each of the plurality of word lines may include a global word line and at least one local word line.

The data selection line SDL<j> may represent a data line in which one half tile Half_Tile_1 is connected to the read/write circuit 200 of FIG. 1. The data selection line SDL <j> may be connected to first to Kth global word lines GWL <1> to GWL <K> (where K is a natural number). The first global word line GWL <1> may be coupled to the data selection line SDL <j> through a first global word line select transistor GX_1, and the first global word line select transistor GX_1 may selectively form an electrical flow path between the first global word line GWL <1> and the data selection line SDL <j> based on first global word line selection signal VGX_1. The connection structure of the first global word line GWL <1> may also be applied to second to Kth global word lines GWL <2> to GWL <K>, the global word line select transistors GX_2 to GX_K, and the global word line select signals VGX_2 to VG_K, in the same manner.

In the same manner, each of the first and Kth global word lines GWL <1> to GWL <K> may be connected to L local word lines (where L is a natural number and is a number independent from L in FIG. 2C) LWL<1> to LWL<K*L>, respectively, by the local word line select transistors LX_11 to LX_1L, to LX_K1 to LX_KL, based on the local word line select signals VLX_11 to VLX_1L, to VLX_K1 to VLX_KL.

A half tile Half_Tile_1 may include memory cells in a region where K*L local word lines and local bit lines intersect.

Figure 3C:
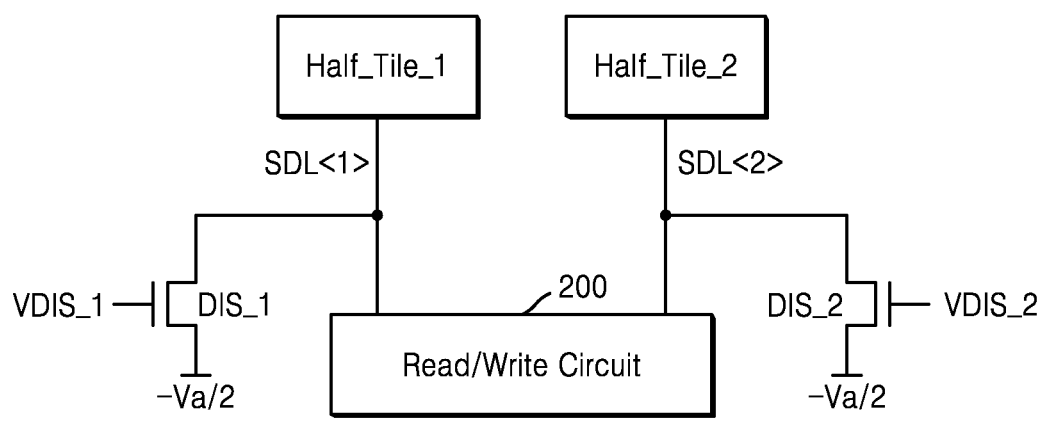
FIG. 3C illustrates a block diagram of a tile and a read/write circuit according to an example embodiment of the inventive concept.

FIG. 3C illustrates a block diagram of a tile and a read/write circuit 200 according to an example embodiment of the inventive concepts. Each of first and second half tiles Half_Tile_1 and Half_Tile_2 of FIG. 3C may also have the same connection structure as the half tile of FIG. 3B.

The first half tile Half_Tile_1 and the second half tile Half_Tile_2 are connected to the read/write circuit 200 through a first data selection line SDL <1> and a second data selection line SDL <2>.

First and second discharge transistors DIS_1 and DIS_2 are connected to first and second data selection lines SDL <1> and SDL <2>, respectively. The first discharge transistor DIS_1 may discharge the first data selection line SDL <1> based on the first discharge control signal VDIS_1. For example, in the word line precharge period in the read operation mode for the selected memory cell included in the first half tile Half_Tile_1, the first discharge transistor DIS_1 may discharge a first data selection line SDL <1>. The second discharge transistor DIS_2 may similarly discharge the second data selection line SDL<2> based on the second discharge control signal VDIS_2.

FIGS. 4A, 4B, 4C and 4D illustrate memory cell 110a according to example embodiments of the inventive concepts.

Figure 4A:
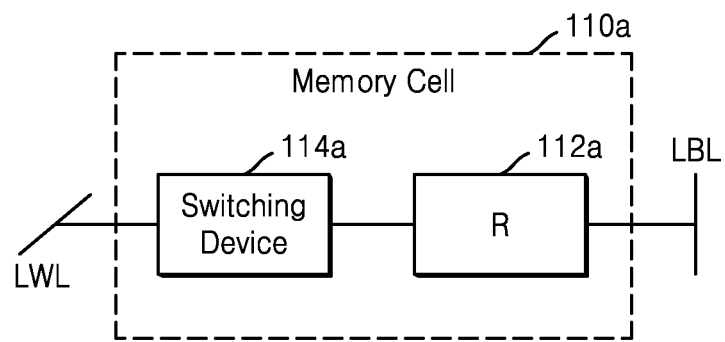
FIGS. 4A, 4B, 4C and 4D illustrate memory cells according to example embodiments of the inventive concepts.

Referring to FIG. 4A, the memory cell 110a may include a variable resistor 112a and a switching device 114a. Here, the variable resistor 112a may be referred to as a variable resistor (or variable resistance material).

In an example embodiment, the variable resistor 112a may be connected between a local bit line LBL and the switching device 114a, and the switching device 114a may be connected between the variable resistor 112a and the local word line LWL. However, in other embodiments of the inventive concepts the switching device 114a may be connected between the local bit line LBL and the variable resistor 112a, and the variable resistor 112a may be connected between the switching device 114a and the local word line LWL.

The variable resistor 112a may be changed to one of a plurality of resistance states using an electrical pulse applied thereto. According to an example embodiment, the variable resistor 112a may include a phase change material whose crystal state changes depending on the amount of current. Such a phase change material may have an amorphous state having a relatively high resistance and a crystalline state having a relatively low resistance. The phase change material may be phase-changed by Joule heat generated according to the amount of current. Furthermore, data may be written using such a phase change.

The switching device 114a may control a current supplied to the variable resistor 112a according to a voltage applied to the connected and selected local word line LWL.

The switching device 114a may be for example an ovonic threshold switch (OTS) including a chalcogenide compound.

Figure 4B:
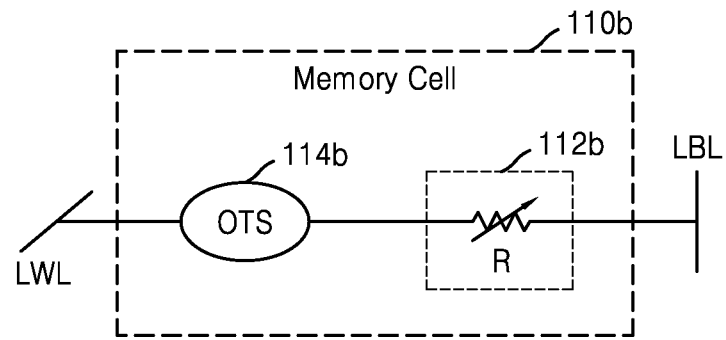

Referring to FIG. 4B, a memory cell 110b may include a variable resistor 112b and an OTS 114b. In other words, FIG. 4B shows an embodiment in which the switching device 114a in FIG. 4A is an OTS 114b.

Figure 4C:
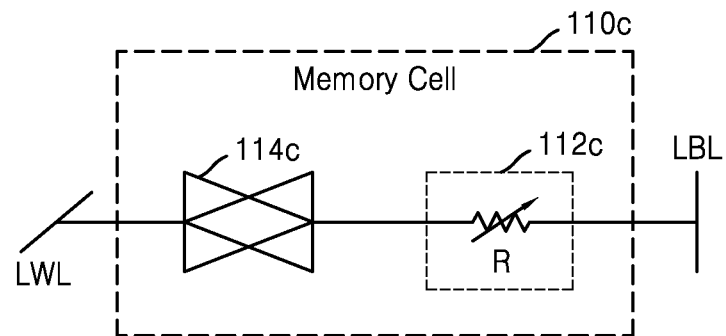

Referring to FIG. 4C, a memory cell 110c may include a variable resistive element 112c and a bi-directional diode 114c. In other words, FIG. 4C shows an embodiment in which the switching device 114a in FIG. 4A is a bi-directional diode 114c.

Figure 4D:
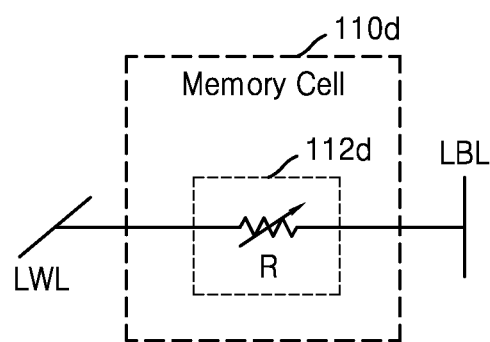

Referring to FIG. 4D, a memory cell 110d may include a variable resistive element 112d. The variable resistive element 112d may be connected between a local word line LWL and a local bit line LBL. The memory cell 110d may store data using voltages applied to the local word line LWL and the local bit line LBL, respectively.

Figure 5A:
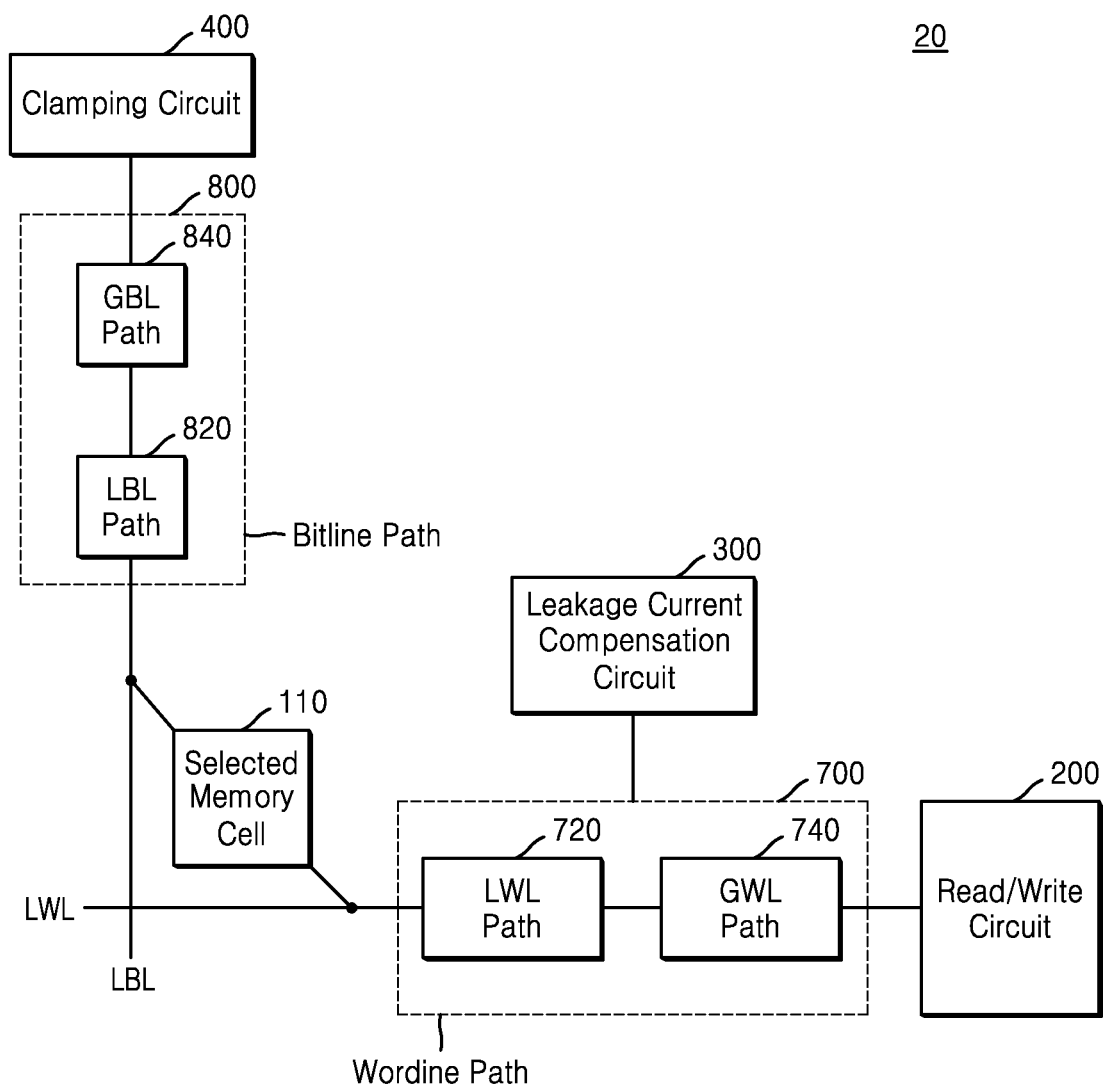
FIGS. 5A, 5B and 5C illustrate a memory device according to an example embodiment of the inventive concepts.
Figure 5B:
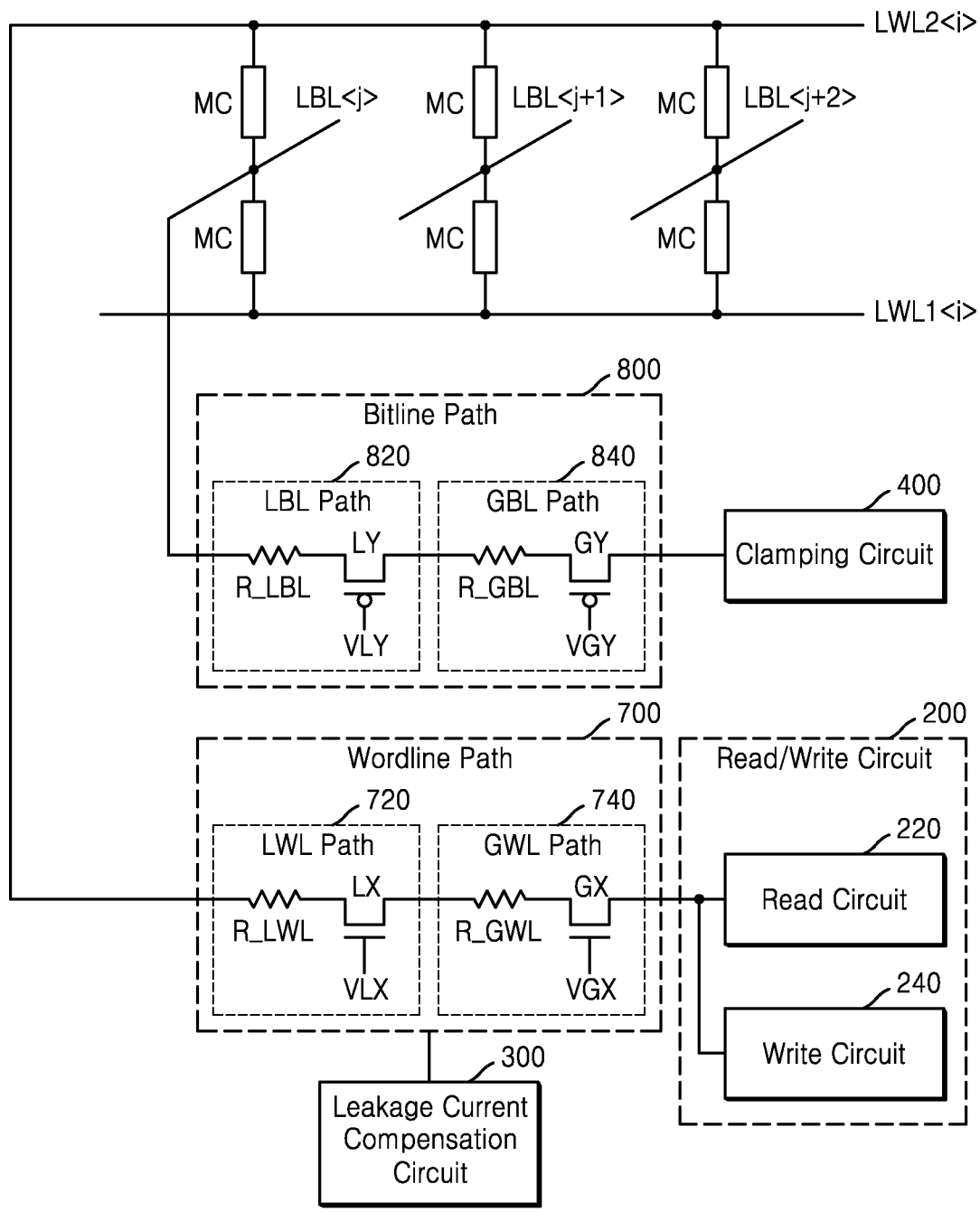
Figure 5C:
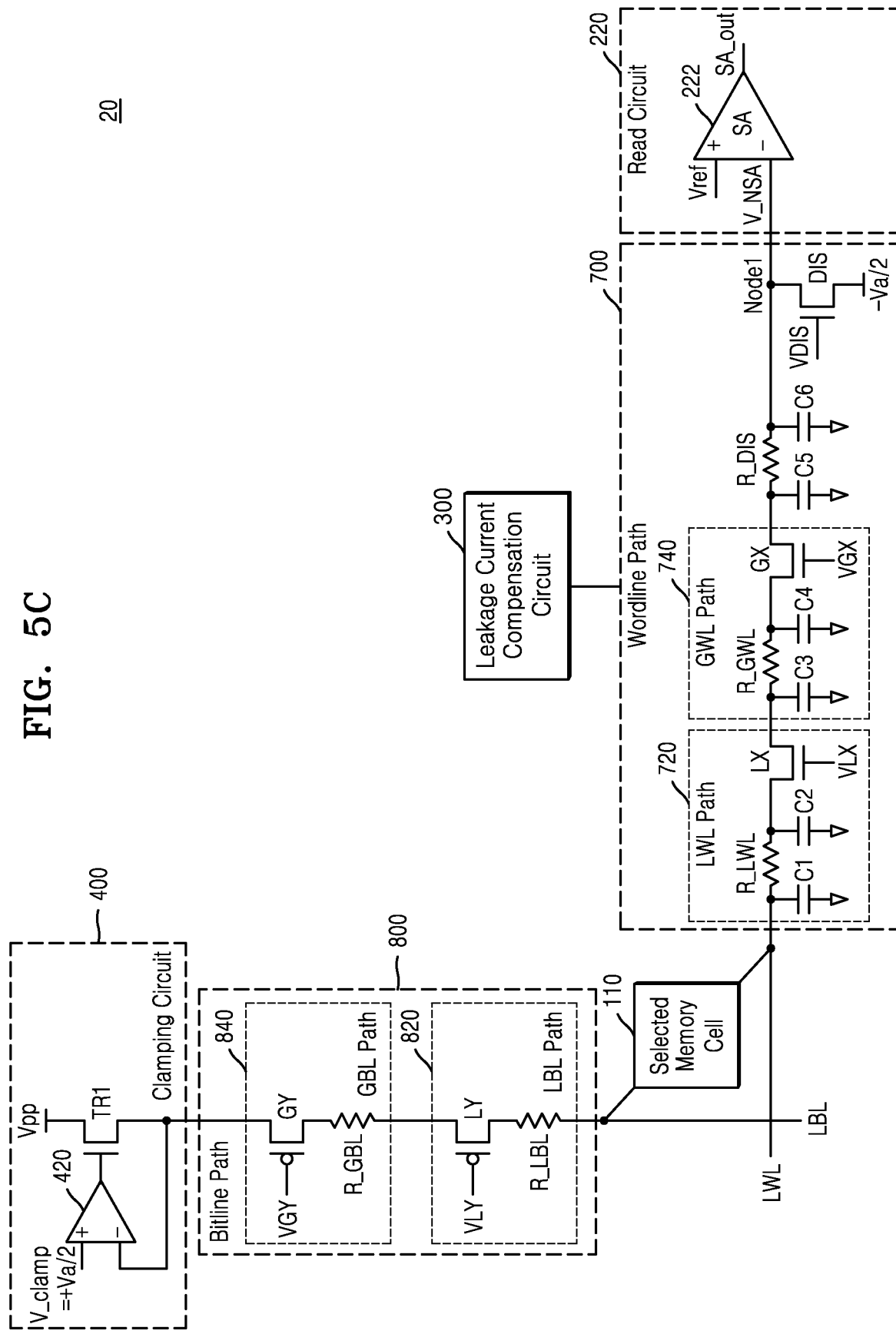

FIGS. 5A, 5B and 5C illustrate a memory device 20 according to an example embodiment of the inventive concepts. Descriptions that are the same as those given with reference FIG. 1 related to the read/write circuit 200, the leakage current compensation circuit 300, and the clamping circuit 400 of FIGS. 5A to 5C will be omitted.

Referring to FIG. 5A, the memory device 20 includes a read/write circuit 200, a leakage current compensation circuit 300, and a clamping circuit 400. The memory device 20 may read data from a selected memory cell 110 arranged between a local word line LWL and a local bit line LBL, which intersect, in a data read mode. The local word line LWL coupled to the selected memory cell 110 may be referred to as a selected local word line, and the local bit line LBL coupled to the selected memory cell 110 may be referred to as a selected local bit line. Furthermore, a global word line connected to the selected local word line may be referred to as a selected global word line, and a global bit line connected to the selected local bit line may be referred to as a selected global bit line.

An electrical path from a node to which the selected memory cell 110 and the local bit line LBL are connected to the clamping circuit 400 may be referred to as a bit line path 800. In the description that follows, the bit line path 800 coupled to the selected memory cell 110 may be referred to as a selected bit line path. The bit line path 800 may include a local bit line path 820 representing the electrical path on the selected local bit line and a global bit line path 840 representing the electrical path on the selected global bit line.

An electrical path from a node to which the selected memory cell 110 and the local word line LWL are connected to the read/write circuit 200 may be referred to as a word line path 700. In the description that follows, the word line path 700 connected to the selected memory cell 110 may be referred to as a selected word line path. The word line path 700 may include a local word line path 720 representing the electrical path on the selected local word line and a global word line path 740 representing the electrical path on the selected global word line.

A plurality of unselected memory cells may be coupled to the selected local word line, and a voltage level of the selected local word line may be increased by leakage currents generated by the plurality of unselected memory cells.

As the leakage current compensation circuit 300 is coupled to the word line path 700, the leakage current compensation circuit 300 may compensate for a first current value, which is the sum of the leakage currents generated by the unselected memory cells.

Referring to FIG. 5B, memory cells may form first and second layers at the local word line LWL1 <i> of the first layer and the local word line LWL2 <i> of the second layer, respectively. A local bit line may be connected to a connection node between a memory cell of the first layer and a memory cell of the second layer. It will be described assuming that a memory cell connected between a j-th local bit line LBL <j> and the i-th local word line LWL2 <i> of the second layer is a selected memory cell MC.

The word line path 700, which represents the electrical path from the selected memory cell to the read/write circuit 200, may include a local word line path 720 and a global word line path 740.

The local word line path 720 may include a local word line resistor R_LWL and a local word line select transistor LX. The local word line select transistor LX may selectively form an electrical flow path between a selected local word line and a selected global word line based on a local word line selection signal VLX. Here, the local word line resistor R_LWL may represent a parasitic resistor included in the local word line path 720.

The global word line path 740 may include a global word line resistor R_GWL and a global word line select transistor GX. The global word line select transistor GX may selectively form an electrical flow path between a selected global word line and the read/write circuit 200 (which may include read circuit 220 and write circuit 240) based on a global word line selection signal VGX. Here, a global word line resistor R_GWL may represent a parasitic resistor included in the global word line path 740.

The bit line path 800, which represents an electrical path from a selected memory cell to the clamping circuit 400, may include a local bit line path 820 and a global bit line path 840.

The local bit line path 820 may include a local bit line resistor R_LBL and a local bit line select transistor LY. The local bit line select transistor LY may selectively form an electrical flow path between a selected local bit line and a selected global bit line based on a local bit line selection signal VLY. Here, the local bit line resistor R_LBL may represent a parasitic resistor included in the local bit line path 820.

The global bit line path 840 may include a global bit line resistor R_GBL and a global bit line select transistor GY. The global bit line select transistor GY may selectively form an electrical flow path between the selected global bit line and the clamping circuit 400 based on the global bit line select signal VGY. Here, the global bit line resistor R_GBL may represent a parasitic resistor included in the global bit line path 840.

The leakage current compensation circuit 300 may be electrically connected to the word line path 700.

Referring to FIG. 5C, the word line path 700 may include a discharge transistor DIS connected to a node that is connected to the read circuit 220 to precharge a selected local word line and a selected global word line based on discharge control signal VDIS.

The clamping circuit 400 includes a first transistor TR1 and an OP amplifier 420. The clamping circuit 400 may precharge the selected global bit line and the selected local bit line in the bit line precharge period in the read operation mode of the memory device 20 using a clamp voltage V_clamp inputted to the OP amplifier 420.

The read circuit 220 includes a sense amplifier 222. The sense amplifier 222 may output a sense amplifier output value SA_out by amplifying a voltage difference value between a voltage of a selected word line to which a selected memory cell is connected and a reference voltage Vref in the read operation mode. In an embodiment, in a charge-sharing period in which a charge of a first node Node1 is shared with the selected local word line in the read operation mode, the sense amplifier 222 may amplify a voltage difference value between a voltage V_NSA of the first node Node1 after the charge is shared and the reference voltage Vref to output a sense amp output value SA_out.

The word line path 700 may include at least one parasitic capacitor thereon. For example, parasitic capacitors included in a local word line path 720, a global word line path 740 and the word line path 700 may be represented as first to sixth capacitors C1 and C2, C3 and C4, and C5 and C6, respectively.

According to an example embodiment of the inventive concepts, the memory device 20 may be configured such that, in a read operation mode, the leakage current compensation circuit 300 compensates for leakage currents caused by unselected cells, thereby making it possible to widely secure a read window and a sensing margin. Since the read window and the sensing margin are widely secured, the memory device 20 may reduce reading errors, thereby improving the reliability of the reading operation.

Figure 6:
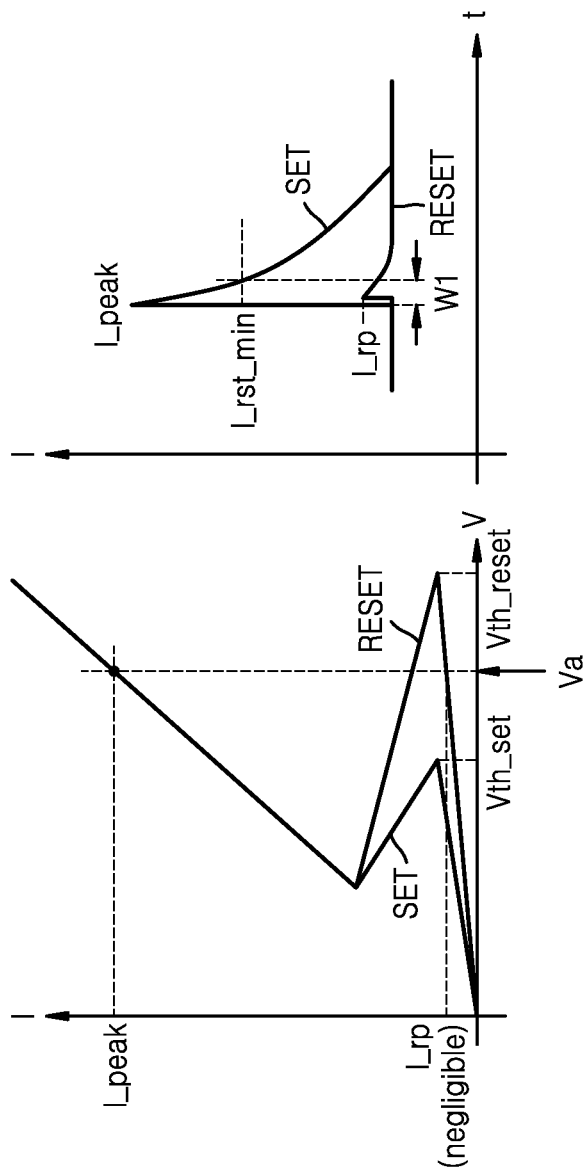
FIG. 6 illustrates a graph of a current-voltage characteristic of a resistive memory cell according to an example embodiment of the inventive concepts and a graph of a current flowing in a memory cell in a crystalline state.

FIG. 6 illustrates a graph of current-voltage characteristics of a resistive memory cell and a graph of current flowing in a memory cell in a crystalline state according to an example embodiment of the inventive concepts. A crystalline state with a low resistance of a resistive memory cell may be referred to as a SET state, and an amorphous state with a high resistance of the resistive memory cell may be referred to as a RESET state.

Referring to a current-voltage characteristic graph of the resistive memory cell, the memory cell may exhibit different current-voltage characteristics in the SET state and the RESET state. The memory device may read data of a selected memory cell by using a difference between the current-voltage characteristics of the SET state and the RESET state in the read operation mode. For example, since the memory device applies a read voltage Va having a value between a threshold voltage Vth_set of the SET state curve and a threshold voltage Vth_reset of the RESET state curve at both ends (i.e., a cross point) of the selected memory cell, a memory cell in the SET state and a memory cell in the RESET state may be distinguished from each other. A method of reading data of a resistive memory cell will be described below with reference to FIG. 5C.

The case where a selected memory cell 110 is in a RESET state will be described first. The memory device 20 may apply a read voltage Va to both ends of the selected memory cell 110 for reading data. For example, since the memory device 20 precharges a selected local word line to a voltage of −Va/2 and precharges a selected local bit line to a voltage of Va/2, the read voltage Va may be applied to both ends of the selected memory cell 110. Referring to the RESET curve on the current-voltage characteristic graph, when the read voltage Va is applied to both ends of the selected memory cell 110 in the RESET state, a current corresponding to the reset peak current I_rp may flow to the selected memory cell 110. In this case, the reset peak current I_rp may represent a current whose value is negligibly small as compared with the peak current I_peak. Thus, a voltage level of the selected local word line may not change, or in other words may be substantially the same, as there is no change.

On the other hand, the case where the selected memory cell 110 is in the SET state will be described. The memory device 20 may apply a read voltage Va across both ends of the selected memory cell 110 for reading data. Referring to the SET curve on the current-voltage characteristic graph, when the read voltage Va is applied to both ends of the selected memory cell 110 in the SET state, a current having a peak current I_peak may instantaneously flow to the selected memory cell 110. Because of parasitic resistors and parasitic capacitors on the bit line path, a value of the peak current I_peak may be exponentially proportional to the read voltage Va. Thus, a graph of the current flowing to both ends of the selected memory cell 110 with respect to time may indicate a SET curve in the graph shown on the right side of FIG. 6.

Referring to the graph on the right side of FIG. 6, when the selected memory cell 110 is in a SET state, a current of a peak current I_peak instantaneously flows to the selected memory cell 110. Afterwards, as a voltage level of the selected local word line is increased by capacitors, a voltage at both ends of the selected memory cell 110 decreases, and as the voltage at both ends of the selected memory cell 110 decreases, a current flowing to the selected memory cell 110 also decreases. In this case, when a current equal to or greater than a reset minimum current value I_rst_min flows to the selected memory cell 110, a state of the selected memory cell 110 may change from a SET state to a RESET state by Joule heat generated due to energization (conduction) of a large current. Since an inadvertent change in a state of the selected memory cell 110 may cause a read error, an occurrence of a read error may be reduced by reducing a first time width W1 on the right graph of FIG. 6.

Figure 7A:
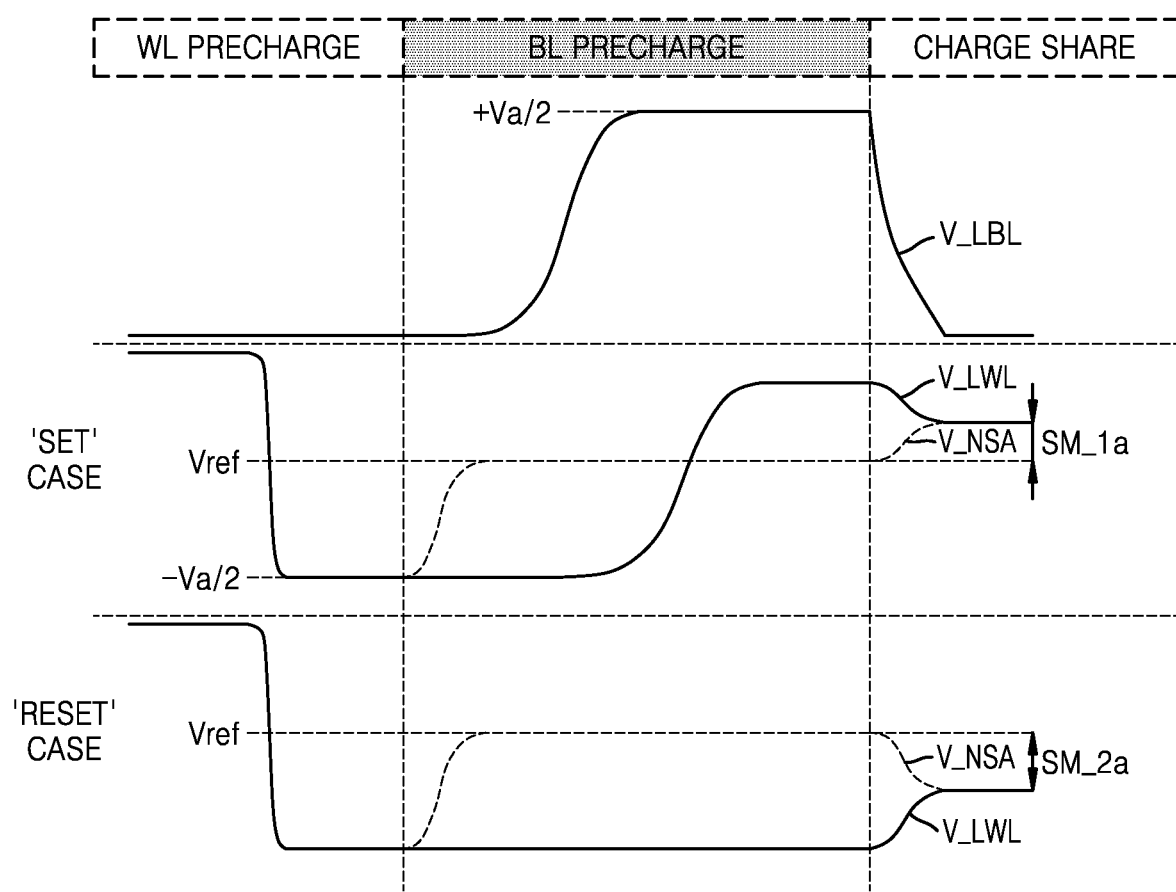
FIGS. 7A and 7B illustrate a voltage graph in a read operation mode according to an example embodiment of the inventive concepts.
Figure 7B:
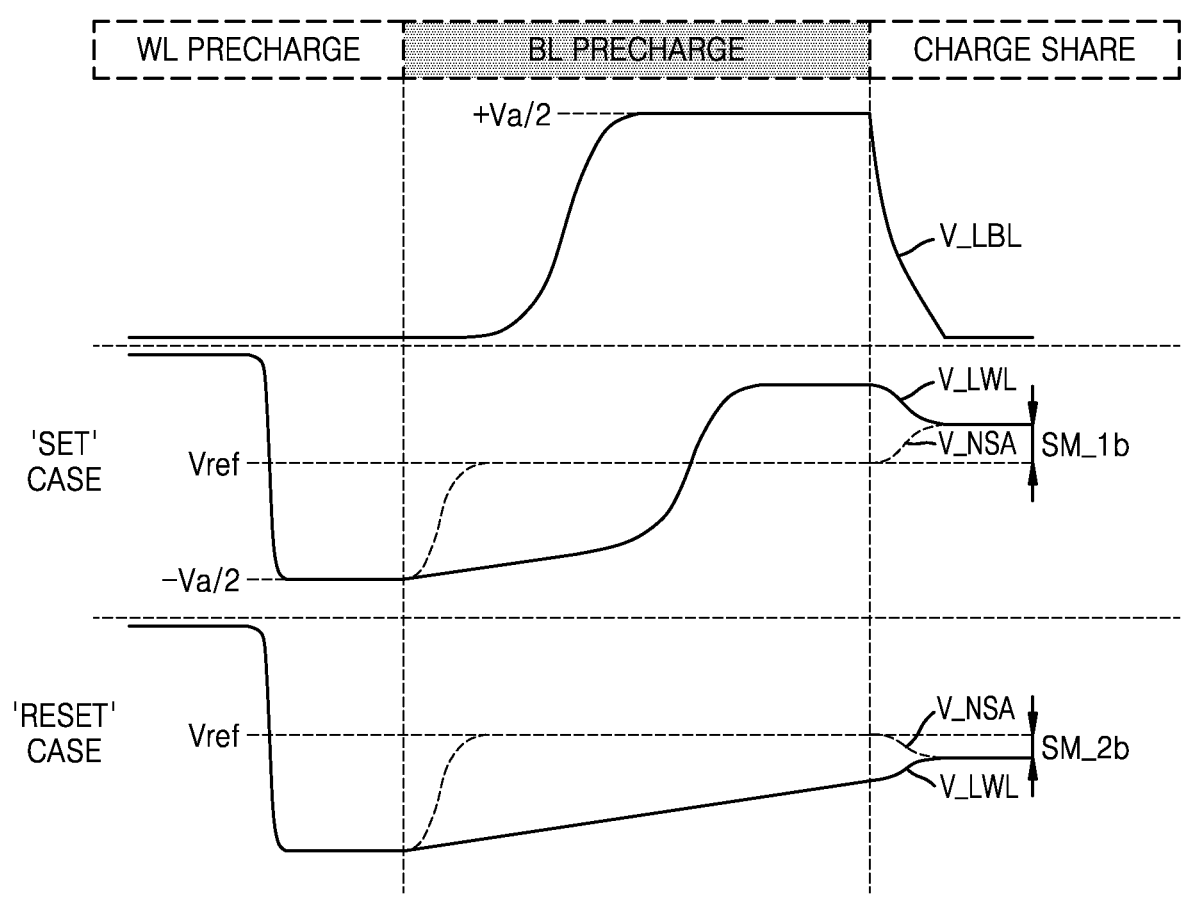

FIGS. 7A and 7B illustrate voltage graphs in a read operation mode according to an example embodiment of the inventive concepts. FIGS. 7A and 7B show voltage graphs when there is no leakage current compensation circuit 300. FIGS. 7A and 7B will be described with reference to FIG. 5C.

In particular, FIG. 7A shows an ideal graph assuming that there is no leakage current due to unselected memory cells. A read operation mode may include a word line precharge period, a bit line precharge period, and a charge share period.

In the word line precharge period, the memory device 20 may precharge the selected global word line and the selected local word line to a first voltage value. The first voltage value may represent a value of half of the negative read voltage Va.

In the bit line precharge period, the memory device 20 may precharge a selected global bit line and a selected local bit line to a second voltage value. The second voltage value may represent a value of half of the read voltage Va. In a bit line precharge period, a word line may be floating. In addition, in the bit line precharge period, as a discharge transistor DIS is turned off, a voltage V_NSA of a first node Node1 may become equal to a reference voltage Vref. When the bit line is precharged and the read voltage Va is applied to the selected memory cell 110, the voltage graph exhibits different characteristics depending on whether a state of the selected memory cell 110 is a SET state or a RESET state.

When the state of the selected memory cell 110 is a SET state, the local word line voltage V_LWL may be greater than the reference voltage Vref by passing current through the selected memory cell 110.

When the state of the selected memory cell 110 is in a RESET state, since a current flowing in the selected memory cell 110 is very small, the local word line voltage V_LWL may stay at the same level as there is no change or substantially no change.

In a charge sharing period, a charge may be shared between the local select word line and the first node Node1. As the local select word line and the first node Node1 share a charge, the local word line voltage V_LWL and a voltage V_NSA of the first node Node1 may have the same value.

After the charge sharing period, the sense amplifier 222 may amplify a voltage difference value between the voltage V_NSA of the first node Node1 and the reference voltage Vref to output a sense amp output value SA_out. Referring to FIG. 7A, when the selected memory cell 110 is in the SET state, the sense amplifier 222 may sense using a margin of a first sensing margin SM_1a, and when the selected memory cell 110 is in the RESET state, the sense amplifier 222 may sense using a margin of a second sensing margin SM_2a.

FIG. 7B shows a graph assuming that there is a leakage current due to unselected memory cells. The differences from the comparison with FIG. 7A will be mainly described.

In the bit line precharge period, the read voltage Va is applied to both ends of the selected memory cell, and a voltage having a half value of the read voltage Va is applied to both ends of the unselected memory cells connected to the selected local word line. Therefore, a current corresponding to the half value of the read voltage Va on the current-voltage graph of FIG. 6 may flow to each of the unselected memory cells. When leakage currents flowing to respective unselected memory cells are summed and flow into the selected local word line, a local word line voltage V_LWL may increase. As the local word line voltage V_LWL increases in the bit line precharge period, two problems may occur.

First, as the local word line voltage V_LWL increases, a magnitude of a voltage at both ends of the selected memory cell 110 may substantially decrease. In other words, an effective value of the read voltage Va may be substantially reduced, and as a result, the memory device 20 may determine the SET state memory cell to be in the RESET state. That is, in the read operation mode, a read window may be reduced.

Second, referring to FIG. 7B, as the local word line voltage V_LWL increases, a sensing margin for the selected memory cell 110 in the RESET state may decrease. For example, comparing with FIGS. 7A and 7B, it may be seen that a second sensing margin SM_2b of FIG. 7B is reduced compared with a second sensing margin SM_2a of FIG. 7A.

Figure 7C:
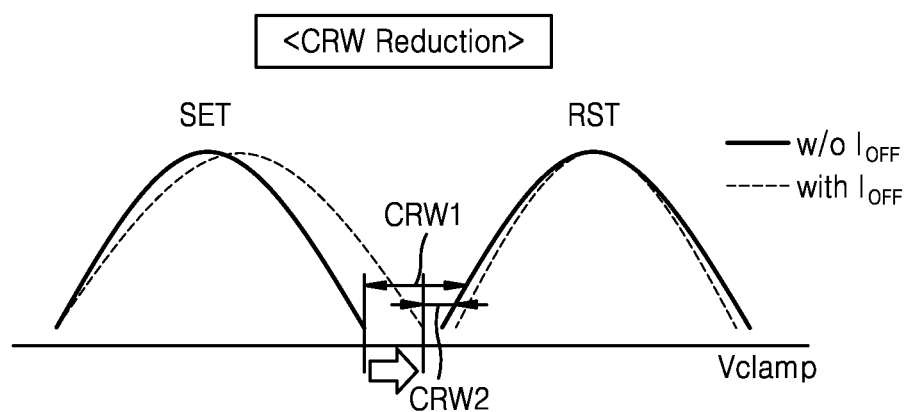
FIG. 7C illustrates a graph of a reduction of a read window and a sensing margin due to a leakage current of a memory device according to an example embodiment of the inventive concepts.
Figure 7C:
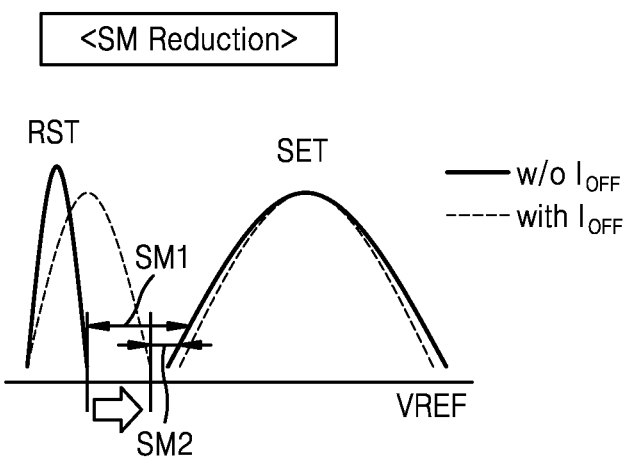

FIG. 7C illustrates graphs of a reduction of a read window (<CRW Reduction>) and a reduction of a sensing margin (<SM Reduction>) due to the leakage current of the memory device according to an example embodiment of the inventive concepts.

Referring to the <CRW Reduction> graph of FIG. 7C, as an effective value of the readout voltage Va substantially decreases, a voltage distribution of the memory cell in the SET state with respect to the Vclamp axis may spread to a right side thereof. Thus, the readout window may be reduced (for example, the readout window may be reduced from a first readout window CRW1 to a second readout window CRW2), and the memory device may determine a memory cell of the SET state as that of the RESET state.

Referring to the <SM Reduction> graph of FIG. 7C, as the local word line voltage increases, a voltage distribution of the memory cell in the RESET state RST with respect to the VREF axis may spread to a right side thereof. Thus, a sensing margin may be reduced. For example, the sensing margin may be reduced from a first sensing margin SM1 to a second sensing margin SM2. As a result, the memory device may determine a memory cell of the RESET state as that of the SET state.

As described above, because the leakage current due to the unselected memory cells reduces the read window and the sensing margin SM1 (or SM2), the memory device 20 needs to compensate for a leakage current generated by the unselected memory cells.

Figure 8A:
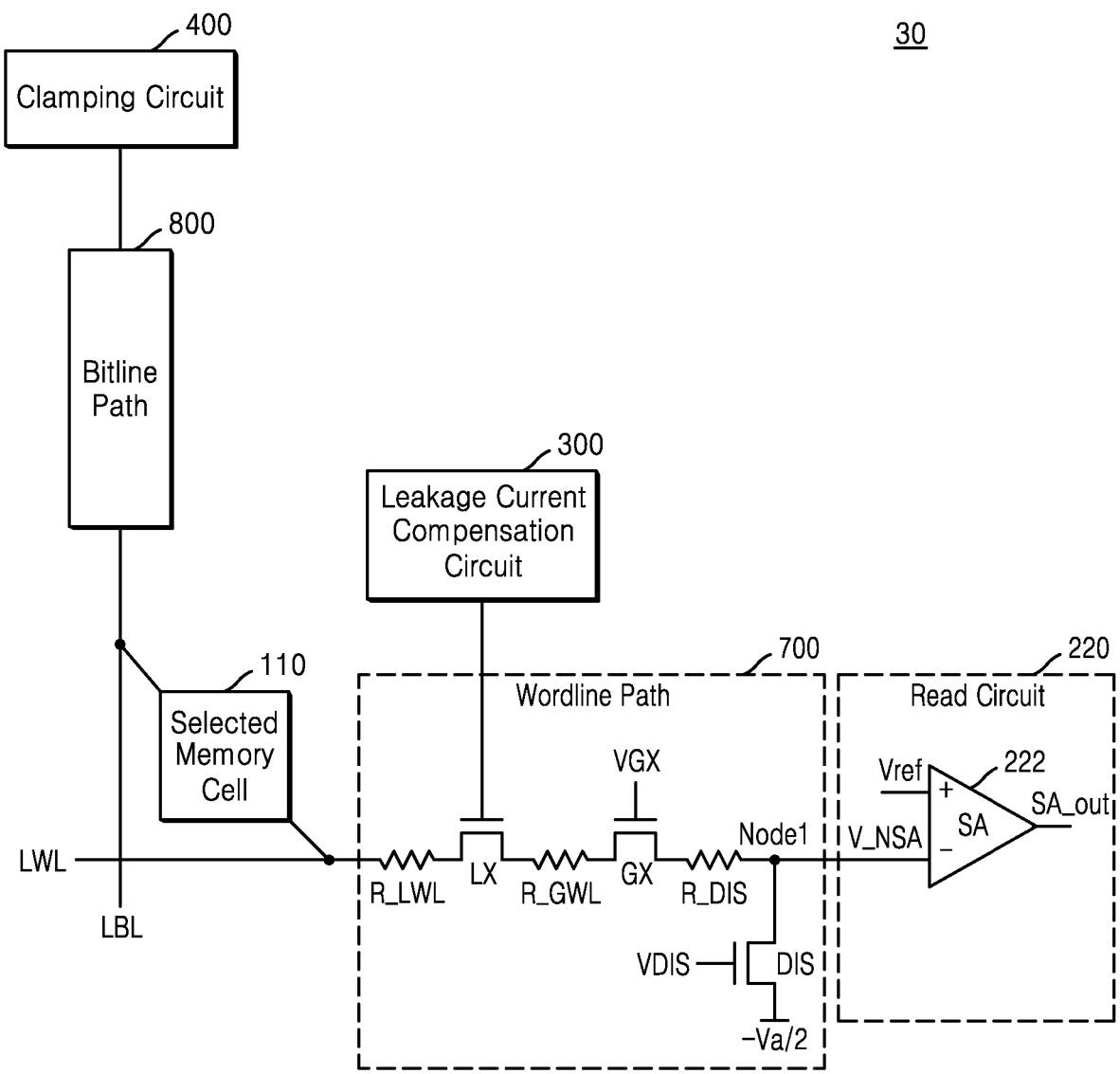
FIGS. 8A and 8B illustrate a memory device according to an example embodiment of the inventive concepts.
Figure 8B:
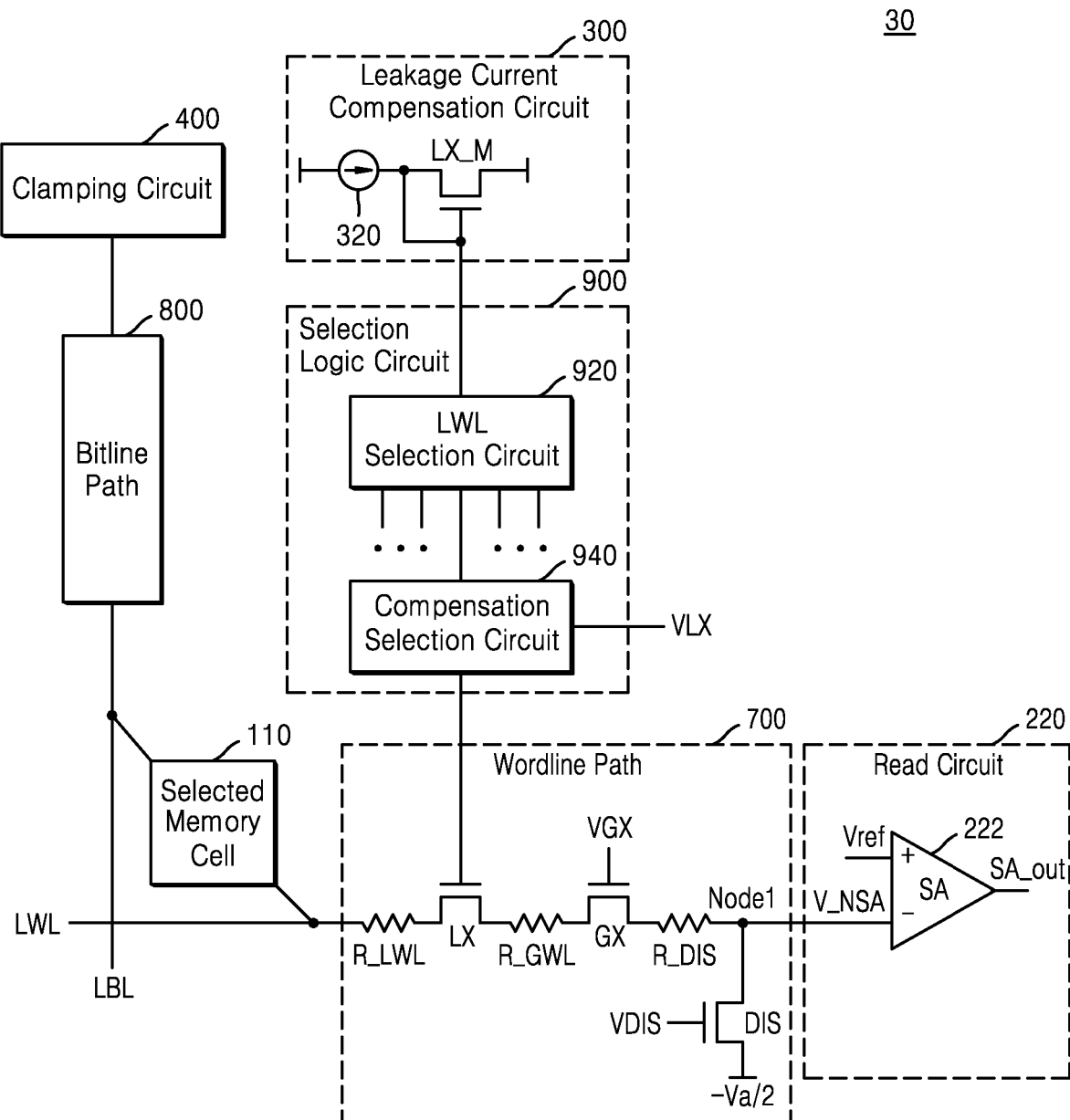

FIGS. 8A and 8B illustrate a memory device 30 according to an example embodiment of the inventive concepts. FIGS. 8A and 8B illustrate an example embodiment in which the leakage current compensation circuit 300 is electrically connected to a local word line select transistor LX on a word line path 700 in a read operation mode of the memory device 30. Description of configuration and functionality of FIGS. 8A and 8B that are the same as given with respect to FIGS. 5A to 5C will be omitted.

Referring to FIG. 8A, in the read operation mode of the memory device 30, the leakage current compensation circuit 300 is electrically connected to the local word line select transistor LX. In an embodiment, the leakage current compensation circuit 300 is electrically coupled to a gate of the local word line select transistor LX. In an embodiment, when the sum of the leakage currents generated by the unselected memory cells connected to the selected local word line is a first current value, the leakage current compensation circuit 300 is configured to make a current of the first current value flow through the local word line select transistor LX. When the leakage current compensation circuit 300 makes the current of the first current value flow through the local word line select transistor LX, the discharge transistor DIS is turned on to form a path through which the current of the first current value flows. In an embodiment, as shown in FIG. 8B, the leakage current compensation circuit 300 may form a current mirror with the local word line select transistor LX.

Referring to FIG. 8B, the memory device 30 may further include a selection logic circuit 900. The selection logic circuit 900 selects a path to which a gate of the local word line select transistor LX is connected. For example, the selection logic circuit 900 may electrically connect the gate of the local word line select transistor LX to the leakage current compensation circuit 300 in the bit line precharge period. In addition, for example, in the word line precharge period and the charge share period, a connection path of the gate of the local word line select transistor LX may be selected such that the gate of the local word line select transistor LX is electrically connected to a signal line to which the local word line select signal VLX is inputted.

The selection logic circuit 900 includes a local word line (LWL) selection circuit 920 and a compensation selection circuit 940.

One end of the local word line selection circuit 920 is connected to the leakage current compensation circuit 300 and the other end of the local word line selection circuit 920 is electrically connected to one of the plurality of local word lines. The leakage current compensation circuit 300 may be provided so that one leakage current compensation circuit is disposed in one memory bank, one leakage current compensation circuit is disposed in one memory bay, or one leakage current compensation circuit is disposed in a single tile. In other words, a plurality of local word line select transistors may share the leakage current compensation circuit 300, and the local word line selection circuit 920 may be configured such that the shared leakage current compensation circuit 300 is electrically coupled to one of the plurality of local word line select transistors.

Figure 8C:
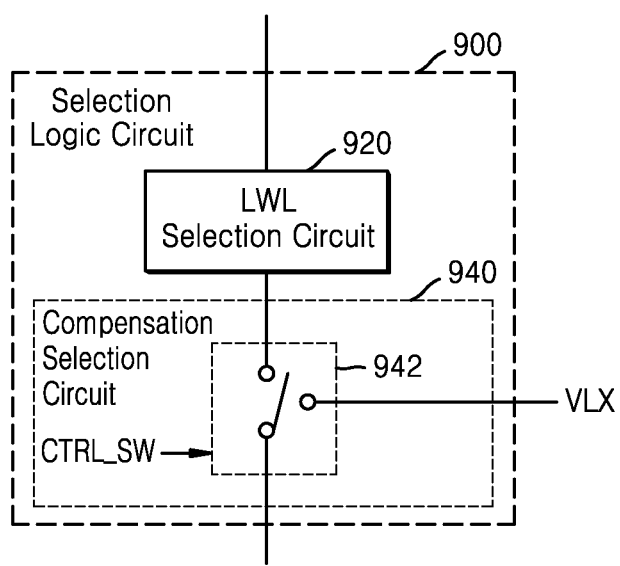
FIG. 8C illustrates a selection logic circuit according to an example embodiment of the inventive concepts.

The compensation selection circuit 940 selectively connects a gate of the local word line select transistor LX to the local word line selection circuit 920 or a signal line to which the local word line selection signal is input, based on a switch control signal CTRL_SW (see FIG. 8C). To this end, the compensation selection circuit 940 may include a switching unit 942 (see FIG. 8C).

The leakage current compensation circuit 300 forms (or is configured as) a current mirror with the local word line select transistor LX to compensate for a first current value by summing the leakage currents of unselected memory cells connected to the selected local word line. In an embodiment, the leakage current compensation circuit 300 includes a transistor LX_M corresponding to the local word line select transistor LX and a current source 320. In an embodiment, the transistor LX_M may have the same characteristics as the local word line select transistor LX. In an embodiment, the transistor LX_M may be the same size as the local word line select transistor LX. The current source 320 may be a current source, which causes a current of a first current value to flow and the first current value is the sum of the leakage currents of unselected memory cells connected to the selected local word line. In an embodiment, the first current value of the current source 320 may be determined based on the I-V characteristic of the resistive memory cell as shown in FIG. 6, and may be a current source for flow of a current of a first current value corresponding to a value obtained by multiplying a second current value, which represents a current value corresponding to a voltage value corresponding to half of the readout voltage, by the number of local bit lines. For example, when the first current value is I_1, the second current value is I_2, and the number of local bit lines is N_BL, the formula is as follows:

$$I\_1 = I\_2 * N\_BL.$$

In an embodiment, the first current value of the current source 320 may be provided so that the leakage current compensation circuit 300 may be characterized as configured to drive a first current value obtained by multiplying a number of bit lines crossing the selected word line by a second current value indicating a leakage current value flowing through each of the unselected memory cells in the selected word line path, to compensate for the total leakage current.

FIG. 8C illustrates a selection logic circuit 900 according to an example embodiment of the inventive concepts. The selection logic circuit 900 includes a local word line selection circuit 920 and a compensation selection circuit 940. Description of configuration and functionality of FIG. 8C that are the same as those given with respect to FIG. 8B as related to the local word line selection circuit 920 and the compensation selection circuit 940 are omitted.

One end of the local word line selection circuit 920 is connected to the leakage current compensation circuit 300 and the other end of the local word line selection circuit 920 is electrically connected to one of the plurality of local word lines.

The compensation selection circuit 940 may electrically connect the local word line select transistor LX to the local word line selection circuit 920 or a signal line to which the local word line selection signal VLX is input based on the switch control signal CTRL_SW. For example, in the bit line precharge period, the compensation selection circuit 940 may cause the memory device to compensate for a leakage current generated by coupling the local word line select transistor LX to the local word line selection circuit 920. Furthermore, for example, in the word line precharge period or the charge share period, since the compensation selection circuit 940 connects a local word line select transistor LX to a signal line to which a local word line selection signal is input, the local word line select transistor LX may be controlled by the local word line selection signal VLX, so that during the charge share period the leakage current compensation circuit 300 is electrically isolated from the selected word line path.

Figure 9:
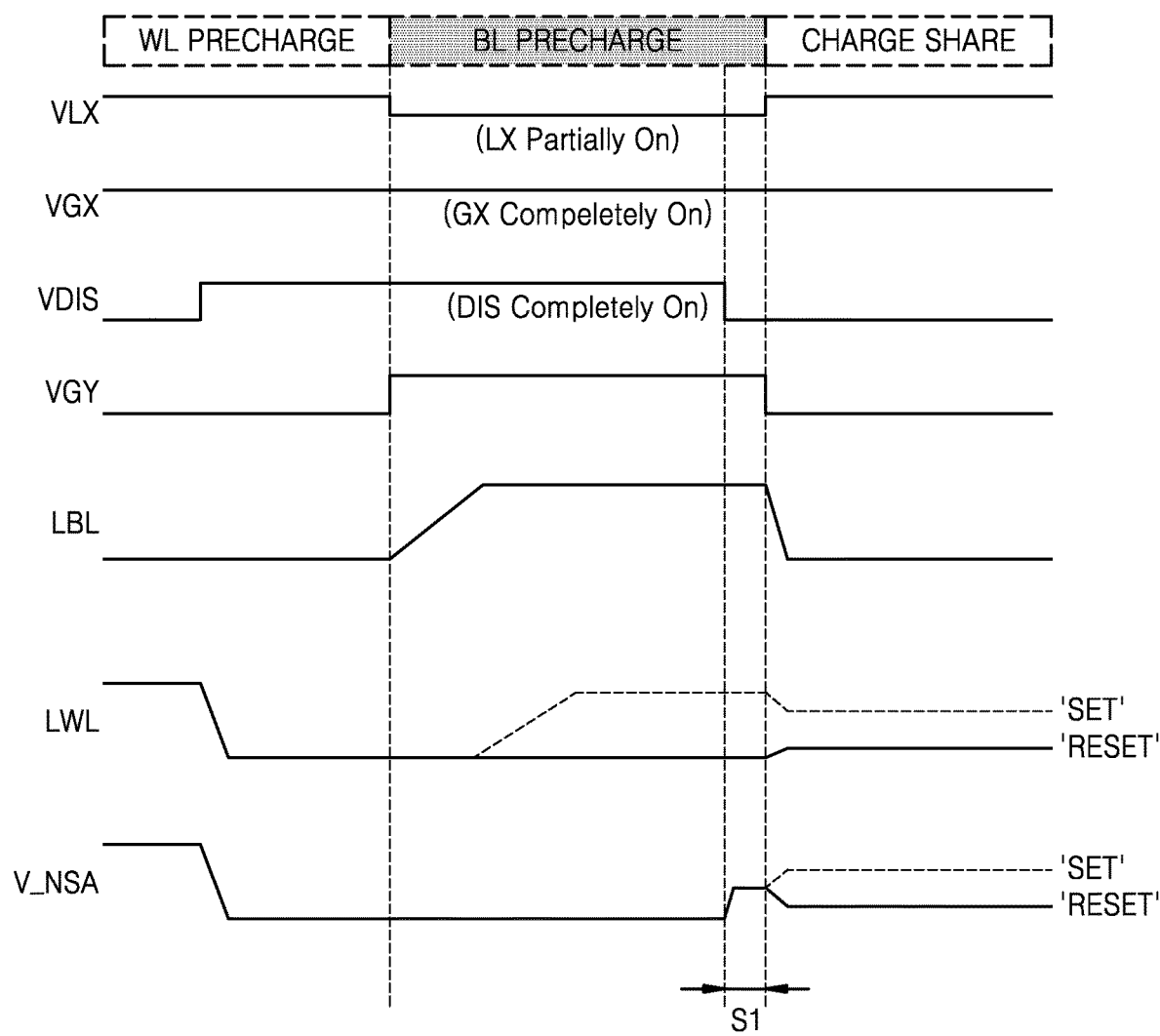
FIG. 9 illustrates a voltage graph in a read operation mode of the memory device of FIGS. 8A-8C according to an example embodiment of the inventive concepts.

FIG. 9 illustrates a voltage graph in the read operation mode of the memory device of FIGS. 8A to 8C according to an example embodiment of the inventive concepts. FIG. 9 will be described with reference to FIG. 8B.

The read operation mode may include a word line precharge period, a bit line precharge period, and a charge share period.

In the word line precharge period, as a voltage level of the discharge control signal VDIS increases, the memory device 30 turns on the discharge transistor DIS. As the discharge transistor DIS is turned on, a voltage level of the selected local word line LWL and a voltage level of the first node Node1 drop to −Va/2.

In the bit line precharge period, the memory device 30 partially drops a voltage level of the local word line selection signal VLX and controls the selection logic circuit 900 such that the local word line select transistor LX is partially turned on by electrically connecting the local word line select transistor LX with the leakage current compensation circuit 300. When the global word line select transistor GX and the discharge transistor DIS are turned on, the memory device 30 forms an electrical path through which a compensation current equivalent to the compensation current generated by the leakage current compensation circuit 300 flows. The memory device 30 precharges the selected local bit line by turning on the global bit line select transistor and the local bit line select transistor. However, before the bit line precharge period ends, in the first period S1, the memory device 30 turns off the discharge transistor DIS. The memory device 30 makes the voltage V_NSA of the first node Node1 equal to the reference voltage Vref by turning off the discharge transistor DIS. The first period S1 may be maintained for a very short period of time compared with the word line precharge period, the bit line precharge period, and the charge share period.

In the charge sharing period, the memory device 30 turns on the local word line select transistor LX to share the charge of the first node Node1 with the selected local word line which is developed. As the selected local word line and the first node Node1 share charge, a voltage V_NSA at the first node Node1 may be different when the selected memory cell 110 is in the SET state and in the RESET state, and a state of the selected memory cell 110 may be determined by comparing the voltage V_NSA with the reference voltage Vref at the sense amplifier 222.

The leakage current compensation circuit 300 compensates for a leakage current generated by the unselected memory cells connected to the selected local word line, thereby making it possible to widely secure a read window and a sensing margin. Since the read window and the sensing margin are widely secured, the memory device 30 may reduce reading errors, thereby improving the reliability of the reading operation.

Figure 10A:
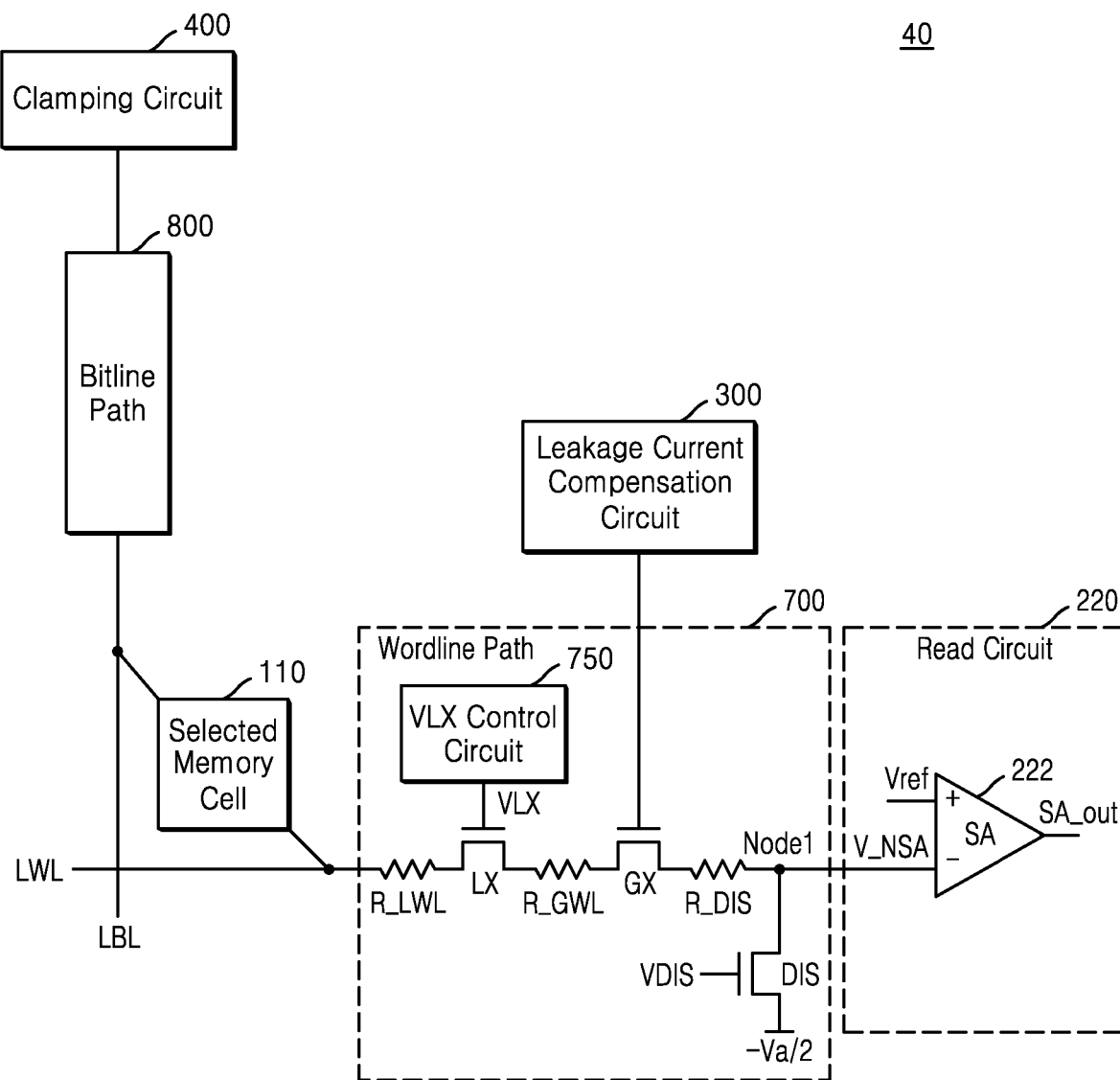
FIGS. 10A and 10B illustrate a memory device according to an example embodiment of the inventive concepts.
Figure 10B:
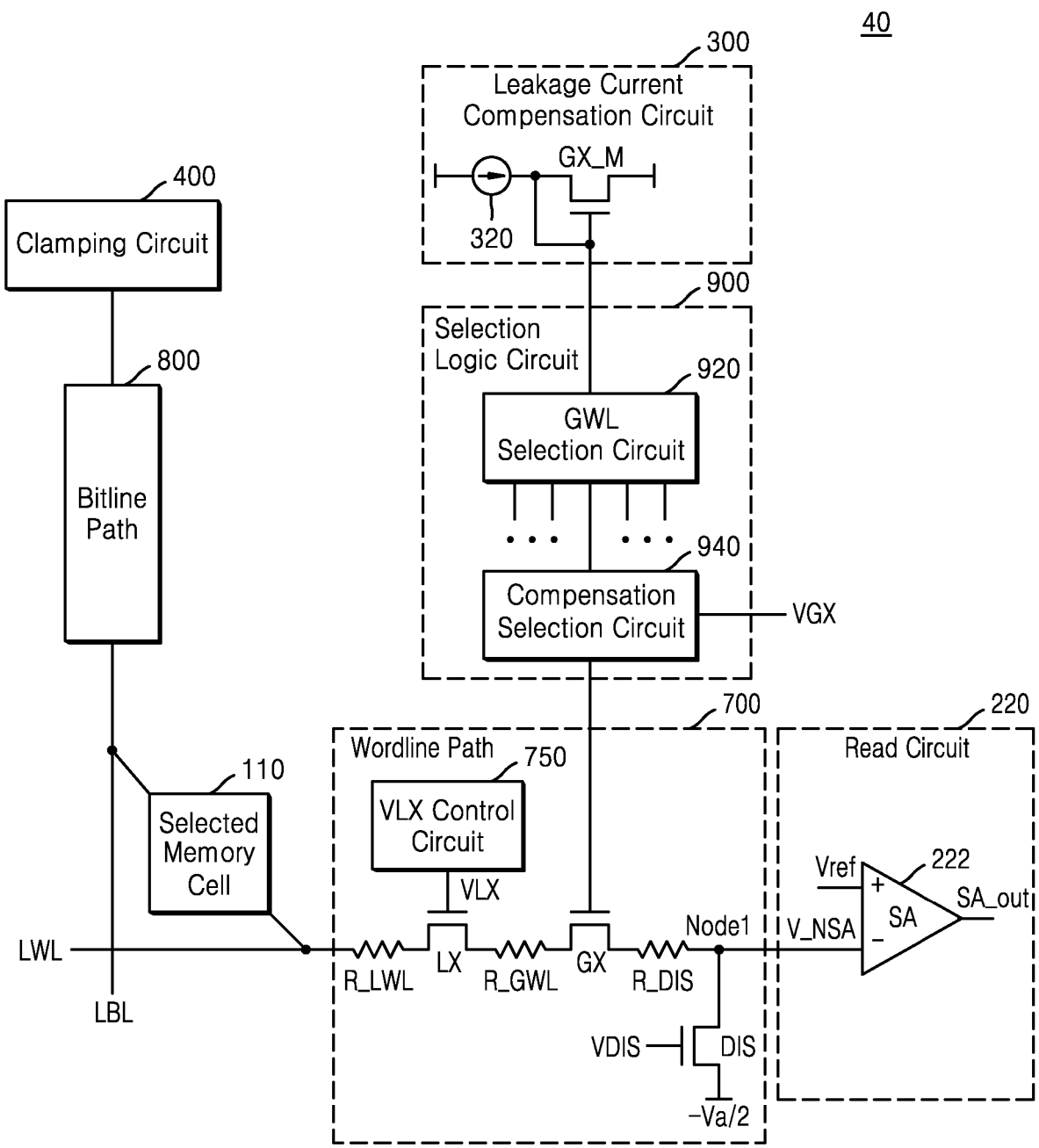

FIGS. 10A and 10B illustrate a memory device 40 according to an example embodiment of the inventive concepts. FIGS. 10A and 10B illustrate an example embodiment in which the leakage current compensation circuit 300 is connected to the global word line select transistor GX on the word line path 700 in the read operation mode of the memory device 40. Description of configuration and functionality of FIGS. 10A and 10B that are the same as those given with respect to FIGS. 5A to 5C will be omitted.

Referring to FIG. 10A, in the read operation mode of the memory device 40, the leakage current compensation circuit 300 is connected to a global word line select transistor GX. In an embodiment, the leakage current compensation circuit 300 is coupled to the gate of the global word line select transistor GX. In an embodiment, when the sum of the leakage currents generated by unselected memory cells connected to the selected local word line is a first current value, the leakage current compensation circuit 300 is connected to the global word line select transistor GX such that the current of the first current value flows through the global word line select transistor GX. As the current of the first current value flows through the global word line select transistor GX, the current of the first current value may also flow through the local word line select transistor LX, and thus the leakage current compensation circuit 300 may compensate for the current. For example, as shown in FIG. 10B, the leakage current compensation circuit 300 may form or be configured as a current mirror together with a global word line select transistor GX.

The memory device 40 may either completely or partially turn on the local word line select transistor LX by controlling the voltage level of the local word line selection signal VLX in the bit line precharge period. A turn-on state of the transistor may include a complete turn-on state and a partial turn-on state. A complete turn-on state of the transistor may indicate a state in which current of both ends of the transistor is fully energized. An equivalent resistance of both ends of the transistor in the complete turn-on state may be less than the equivalent resistance of both ends of the transistor in the partial turn-on state. A partial turn-on state of a transistor may indicate a state of a transistor which makes the equivalent resistance of both ends higher than the equivalent resistance of a full turn-on transistor by applying a small voltage to the gate compared to a complete turn-on state. To control the voltage level of the local word line selection signal VLX applied to the gate of the local word line select transistor LX, the word line path 700 includes a local word line selection signal control circuit 750. In other words, since the local word line selection signal control circuit 750 controls the voltage level of the local word line selection signal VLX, the local word line select transistor LX may be fully turned on or partially turned on.

In the bit line precharge period, when the memory device 40 fully turns on the local word line select transistor LX, since a charge is shared between the first node Node1 and the selected local word line from the bit line precharge period, a sensing margin may be widely secured.

In the bit line precharge period, when the memory device 40 partially turns on the local word line select transistor LX, since capacitors connected to the selected global word line of the capacitors connected in parallel to the selected local word line are excluded, the equivalent capacitance may be reduced. When the equivalent capacitance is reduced, there may be a good effect that the first width W1 is reduced in the current graph of the SET state as viewed from the right side of FIG. 6.

Referring to FIG. 10B, the memory device 40 further includes a selection logic circuit 900. The selection logic circuit 900 selects the connection path of the global word line select transistor GX. For example, the global word line (GWL) selection circuit 920 of the selection logic circuit 900 electrically connects the global word line select transistor GX to the leakage current compensation circuit 300 in the bit line precharge period. In addition, for example, in the word line precharge period and the charge share period, the compensation selection circuit 940 of the selection logic circuit 900 selects the global word line select transistor GX such that the global word line select transistor GX is electrically connected to the signal line to which the global word line select signal VGX is inputted.

It should be understood that the selection logic circuit 900 including the global word line selection circuit 920 and the compensation selection circuit 940 performs the same functions as the selection logic circuit 900 described with reference to FIG. 8B.

The leakage current compensation circuit 300 forms (or is configured as) a current mirror with the global word line select transistor GX to compensate for a first current value summing the leakage currents of unselected memory cells connected to the selected local word line. In an embodiment, the leakage current compensation circuit 300 includes a transistor GX_M corresponding to the global word line select transistor GX and a current source 320. In an embodiment, the transistor GX_M may have the same characteristics as global word line select transistor GX. In an embodiment, the transistor GX_M may be the same size as global word line select transistor GX.

Figure 11A:
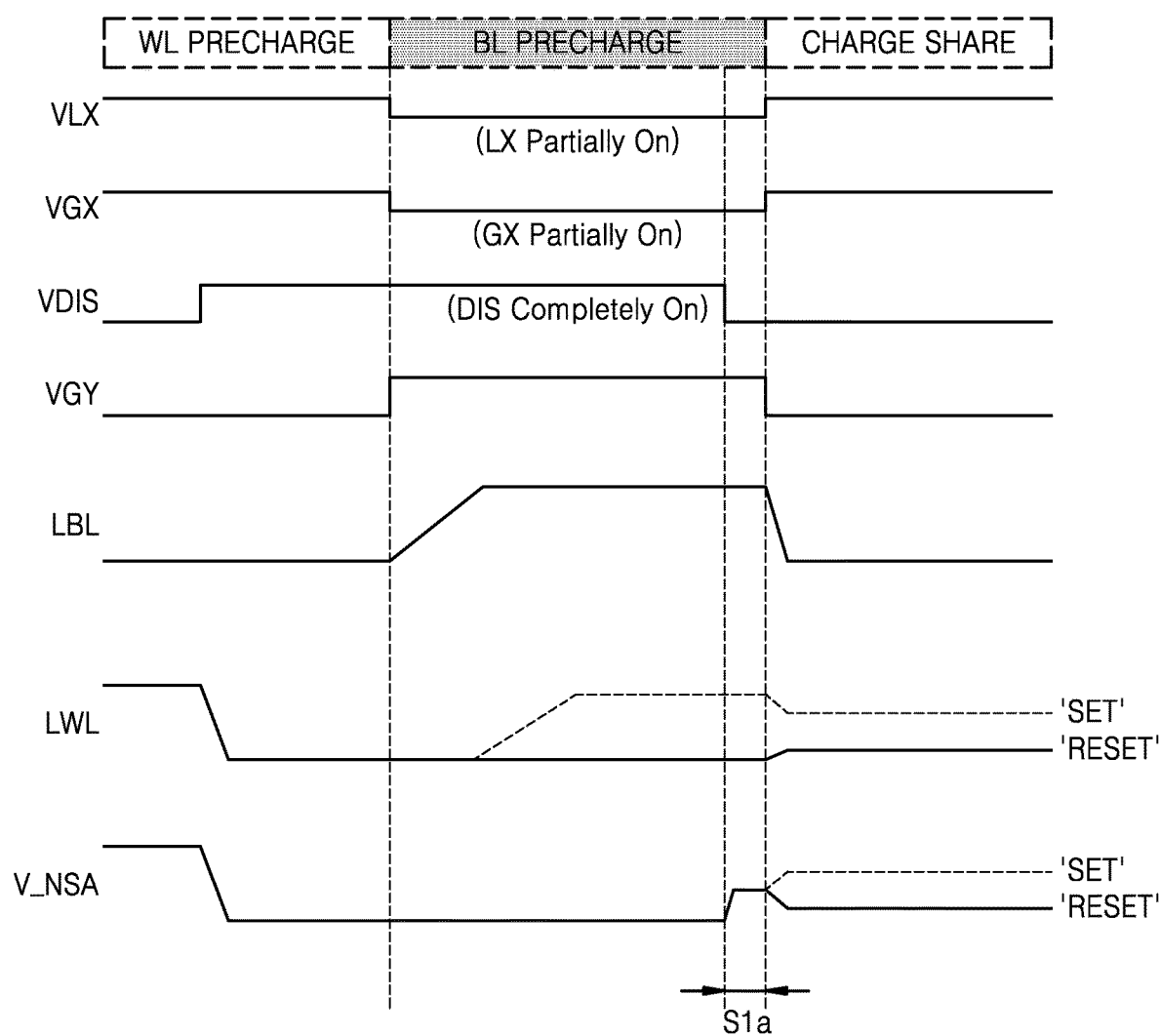
FIGS. 11A and 11B illustrate a voltage graph in a read operation mode of the memory device of FIGS. 10A and 10B according to an example embodiment of the inventive concepts.
Figure 11B:
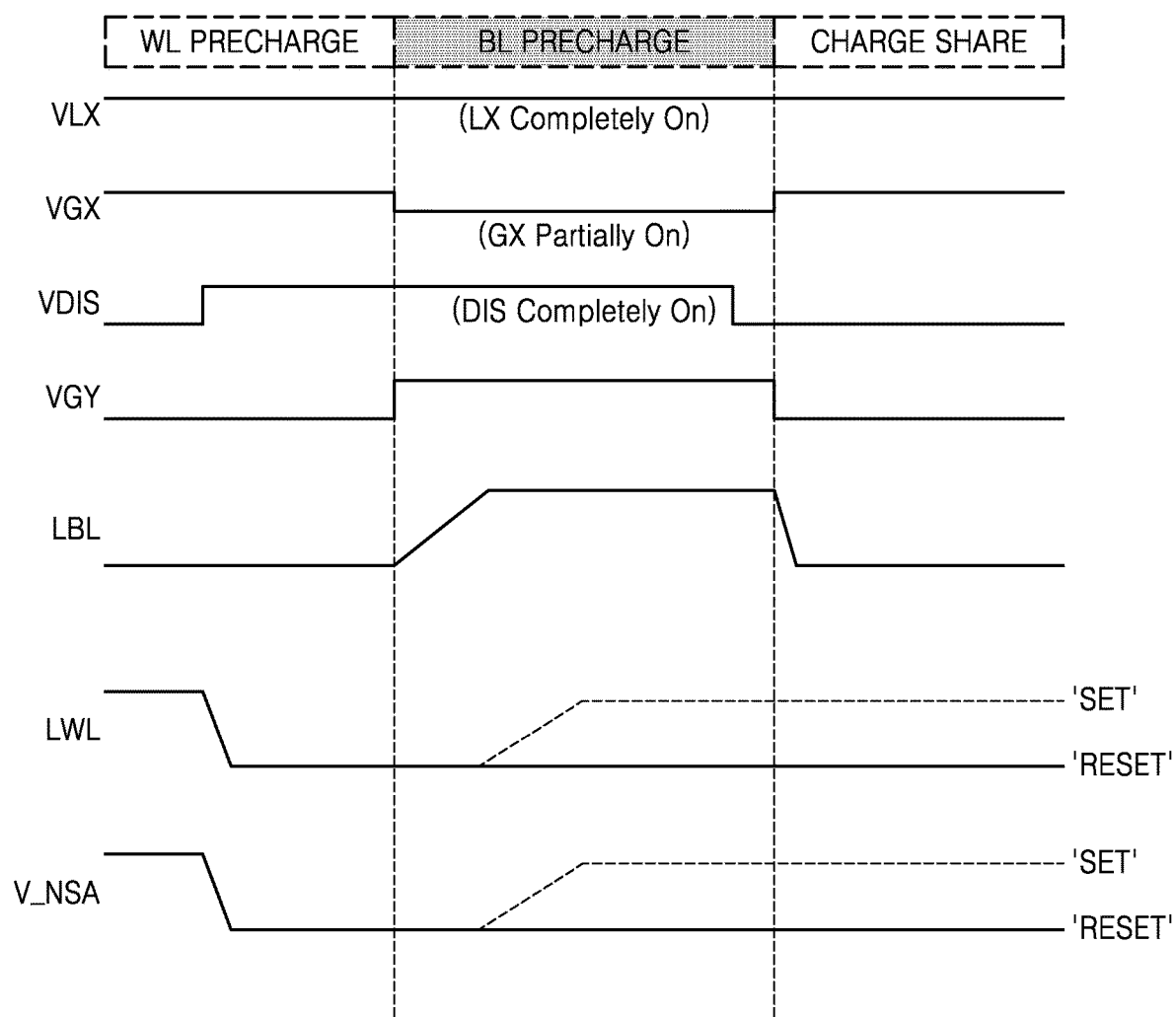

FIGS. 11A and 11B illustrate voltage graphs in the read operation mode of the memory device 40 of FIGS. 10A and 10B according to an example embodiment of the inventive concepts. Description of aspects of FIGS. 11A and 11B that are the same as those given with reference to FIG. 9 will be omitted.

In FIG. 11A, in the bit line precharge period, the memory device 40 partially turns on the local word line select transistor LX. The other graphs may illustrate the same trend as those in FIG. 9.

In FIG. 11B, in the bit line precharge period, the memory device 40 fully turns on the local word line select transistor LX. In the bit line precharge period, as the local word line select transistor LX is fully turned on, the selected local word line LWL and the first node Node1 share charge. Accordingly, after the charge sharing period is completed, the sense amplifier 222 may sense the SET and RESET states of the selected memory cell 110 using a larger sensing margin.

Figure 12A:
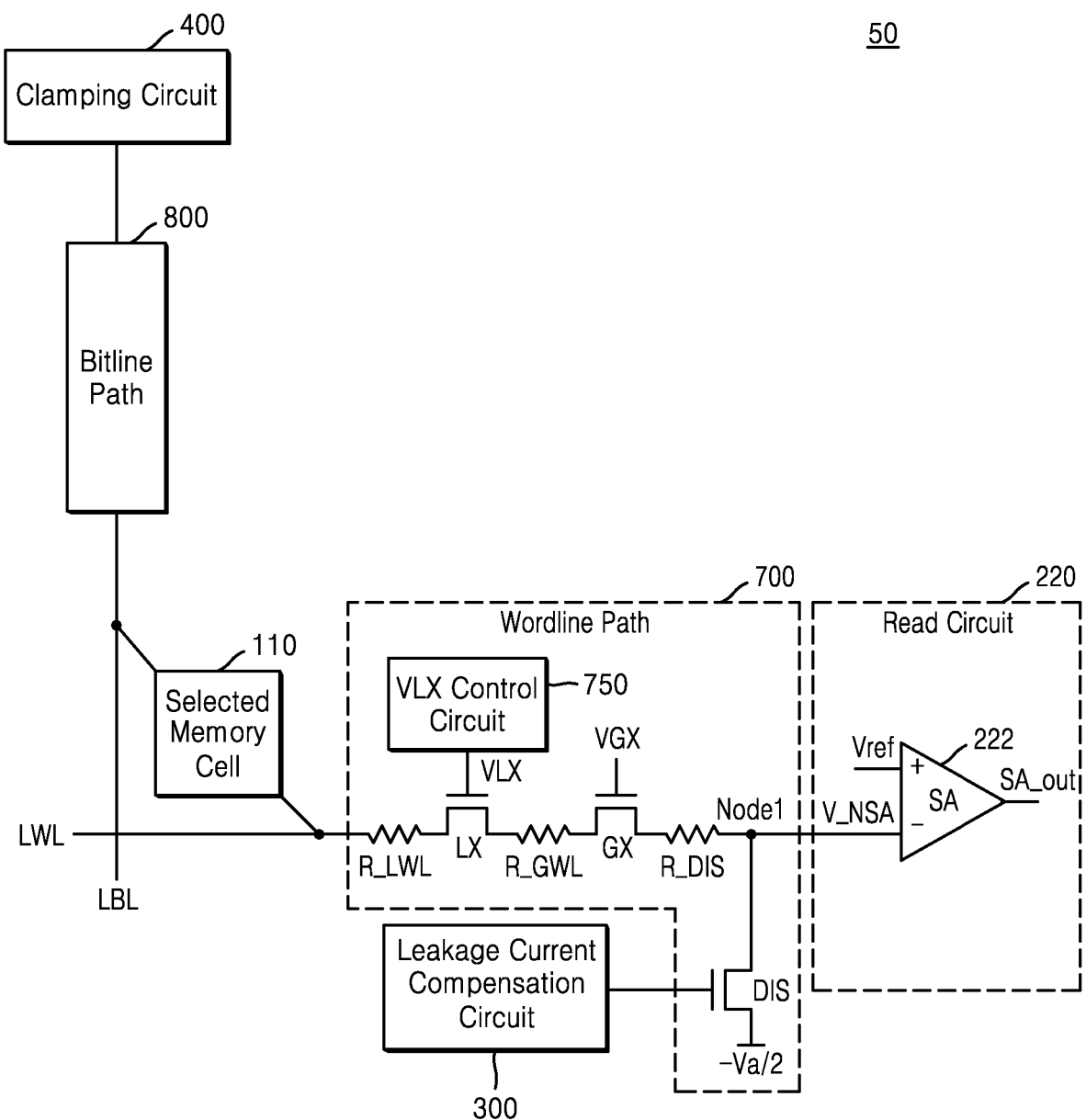
FIGS. 12A and 12B illustrate a memory device according to an example embodiment of the inventive concepts.
Figure 12B:
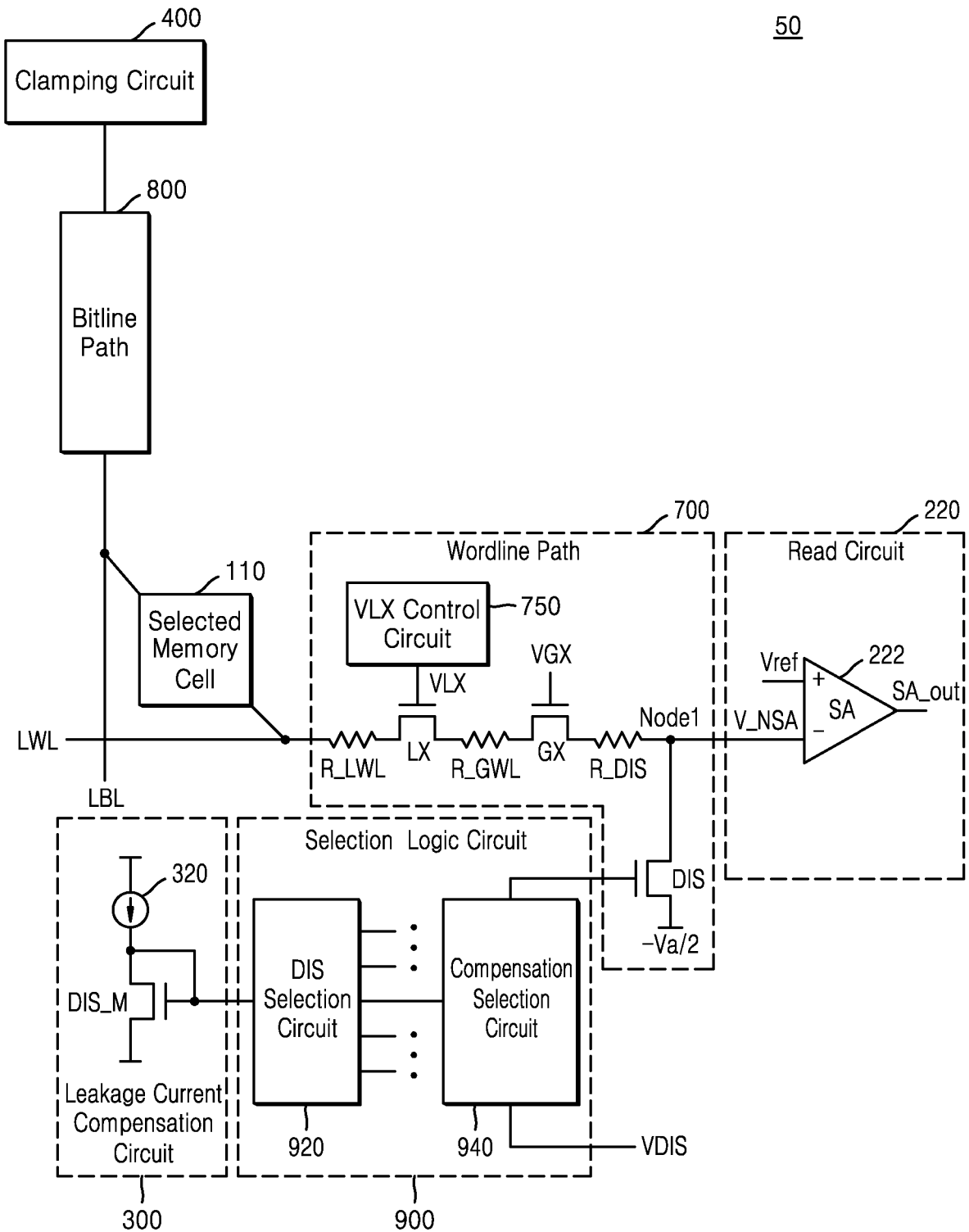

FIGS. 12A and 12B illustrate a memory device 50 according to an example embodiment of the inventive concepts. FIGS. 12A and 12B illustrate an example embodiment in which, in the read operation mode of the memory device 50, the leakage current compensation circuit 300 is electrically connected to the discharge transistor DIS that is connected to the first node Node1. Description of configuration and functionality of FIGS. 12A and 12B that are the same as those given with respect to FIGS. 5A to 5C will be omitted.

Referring to FIG. 12A, in the read operation mode of the memory device 50, the leakage current compensation circuit 300 is electrically connected to the discharge transistor DIS. In an embodiment, the leakage current compensation circuit 300 is electrically connected to the gate of the discharge transistor DIS. In an embodiment, when a value summing the leakage currents generated by the unselected memory cells connected to the selected local word line is a first current value, the leakage current compensation circuit 300 is configured such that the current of the first current value flows through the discharge transistor DIS. As the current of the first current value flows through the discharge transistor DIS, the current of the first current value may flow through the global word line select transistor GX and the local word line select transistor LX, and thus, the leakage current compensation circuit 300 may compensate for the leakage current. For example, as shown in FIG. 12B, the leakage current compensation circuit 300 may form a current mirror together with the discharge transistor DIS.

The memory device 50 may either completely or partially turn on the local word line select transistor LX by controlling the voltage level of the local word line selection signal VLX in the bit line precharge period. To control the voltage level of the local word line selection signal VLX applied to the gate of the local word line select transistor LX, the word line path 700 includes a local word line selection signal control circuit 750. In other words, since the local word line selection signal control circuit 750 controls the voltage level of the local word line selection signal VLX, the local word line select transistor LX may be fully turned on or partially turned on.

Referring to FIG. 12B, the memory device 50 further includes a selection logic circuit 900. The selection logic circuit 900 selects the connection path of the discharge transistor DIS. For example, the DIS selection circuit 920 of the selection logic circuit 900 electrically connects the discharge transistor DIS to the leakage current compensation circuit 300 in the bit line precharge period. In addition, for example, in the word line precharge period and the charge share period, the compensation selection circuit 940 of the selection logic circuit 900 selects the connection path of the discharge transistor DIS such that the discharge transistor DIS is electrically connected to the signal line to which the discharge control signal VDIS is inputted.

It should be understood that the selection logic circuit 900 including the DIS selection circuit 920 and the compensation selection circuit 940 performs the same functions as the selection logic circuit 900 described with reference to FIG. 8B.

The leakage current compensation circuit 300 forms a current mirror with the discharge transistor DIS to compensate for the first current value summing the leakage currents of unselected memory cells connected to the selected local word line. In an embodiment, the leakage current compensation circuit 300 includes a transistor DIS_M corresponding to the discharge transistor DIS and a current source 320.

Figure 13A:
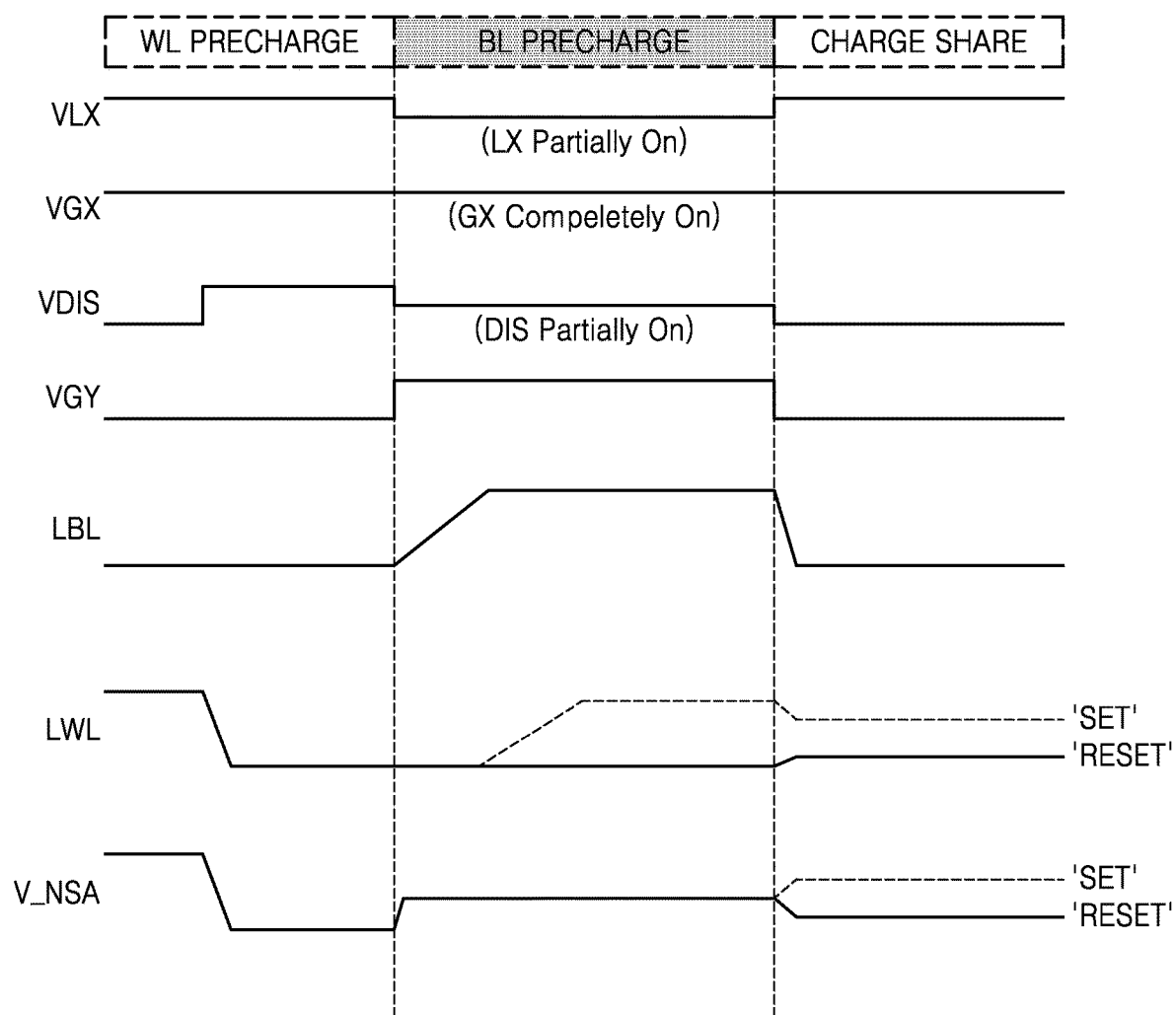
FIGS. 13A and 13B illustrate voltage graphs in a read operation mode of the memory device of FIGS. 12A and 12B according to an example embodiment of the inventive concepts.
Figure 13B:
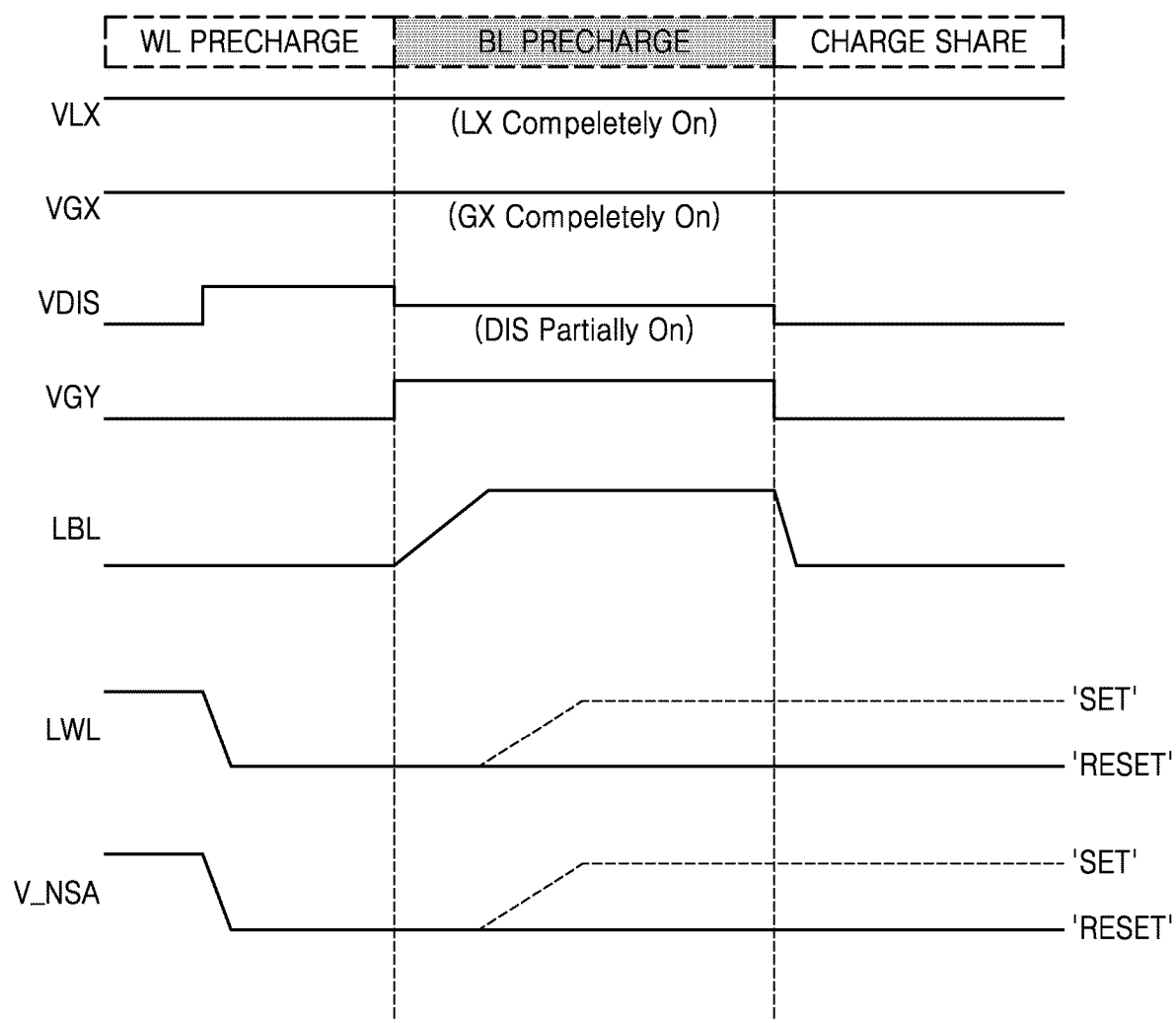

FIGS. 13A and 13B illustrate voltage graphs in the read operation mode of memory device 50 of FIGS. 12A and 12B according to an example embodiment of the inventive concepts. Description of aspects of FIGS. 13A and 13B that are the same as those given with respect to FIGS. 9, 11A and 11B will be omitted.

Referring to FIG. 13A, in the bit line precharge period, the memory device 50 partially turns on the local word line select transistor LX. Furthermore, in the bit line precharge period, since the memory device 50 connects the discharge transistor DIS to the leakage current compensation circuit 300, the discharge transistor DIS may be partially turned on.

Referring to FIG. 13B, in the bit line precharge period, the memory device 50 fully turns on the local word line select transistor LX. In the bit line precharge period, as the local word line select transistor LX is fully turned on, the selected local word line LWL and the first node Node1 share charge. Accordingly, after the charge sharing period is completed, the sense amplifier 222 may sense the SET and RESET states of the selected memory cell 110 using a larger sensing margin.

Figure 14:
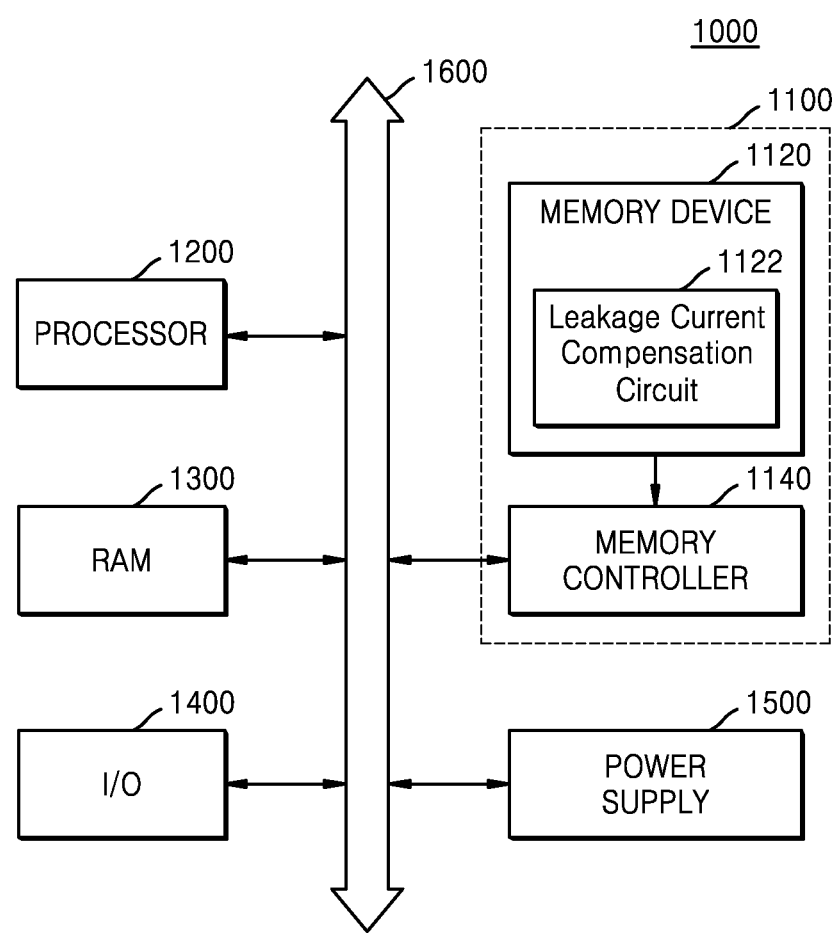
FIG. 14 illustrates a diagram of a computing system device including a memory device that compensates for leakage currents of unselected memory cells according to an embodiment of the inventive concepts.

FIG. 14 illustrates a diagram of a computing system device 1000 including a memory device that compensates for leakage currents of unselected memory cells according to an embodiment of the inventive concepts.

Referring to FIG. 14, the computing system device 1000 includes nonvolatile memory device 1100, processor 1200 that controls overall operation of the computing system device 1000, RAM 1300 that may store system software, input/output (I/O) 1400 that functions as a user interface, and power supply 1500 all connected to bus 1600.

The nonvolatile memory device 1100 includes memory device 1120 such as illustrated in FIG. 1 for example, and a memory controller 1140 configured to read/write data from/to memory device 1120 responsive to commands from the processor 1200 for example. Memory device 1120 includes leakage current compensation circuit 1122 which may be configured and function such as leakage current compensation circuit 300 of the embodiments described with respect to FIGS. 5A-13B.

When the computing system device 1000 is a mobile device, a battery for supplying an operating voltage thereof and a modem such as a baseband chipset may be additionally provided. In addition, it should be understood by those of ordinary skill in the art that the computing system device 1000 may further include for example an application chipset, a camera image processor (CIS), a mobile dynamic RAM (DRAM), among various other components, and thus, a detailed description thereof is omitted.

As described above, example embodiments have been disclosed in the drawings and specification. While the embodiments have been described herein with reference to specific terms, it should be understood that they have been used only for the purpose of describing technical ideas of the inventive concepts and not for limiting the scope of the inventive concepts. Therefore, those skilled in the art will appreciate that various modifications and equivalent embodiments are possible without departing from the scope of the inventive concepts.

While the inventive concepts have been particularly shown and described with reference to embodiments thereof, it should be understood that various changes in form and details may be made therein without departing from the spirit and scope of the inventive concepts.

What is claimed is:

1. A memory device comprising:
   a first transistor disposed in an electrical path between a selected memory cell of a plurality of memory cells and a read/write circuit of the memory device; and
   a leakage current compensation circuit comprising a second transistor connected to a gate of the first transistor and having characteristics that are the same as characteristics of the first transistor,
   wherein the leakage current compensation circuit is configured to cause a current having a same magnitude as a leakage current generated by unselected memory cells connected to a selected word line to which the selected memory cell is connected to flow through the first transistor, in a read operation mode of the memory device that reads data from the selected memory cell.

2. The memory device of claim 1, wherein the leakage current compensation circuit is configured as a current mirror together with the first transistor.

3. The memory device of claim 1, further comprising a sense amplifier configured to amplify, in the read operation mode, a voltage difference value between a voltage of a selected word line connected to the selected memory cell and a reference voltage; and
   wherein the leakage current compensation circuit is configured to connected to a selected word line path from the selected memory cell to the sense amplifier.

4. The memory device of claim 3, wherein the plurality of memory cells are arranged at points where a plurality of word lines and a plurality of bit lines intersect,
   wherein each of the plurality of word lines comprises a global word line and a plurality of local word lines,
   wherein each of the plurality of bit lines comprises a global bit line and a plurality of local bit lines,
   wherein one end of the selected memory cell is connected to a selected local word line from among the plurality of local word lines that is connected to a selected global word line from among the plurality of word lines, and
   wherein the selected word line path comprises a selected local word line path representing an electrical path from the one end of the selected memory cell to the selected global word line, and a selected global word line path representing an electrical path from the selected global word line to the sense amplifier.

5. The memory device of claim 4, wherein the leakage current compensation circuit is coupled to a local word line select transistor disposed in the selected local word line path and configured to selectively form an electrical flow path between the selected local word line and the selected global word line.

6. The memory device of claim 4, wherein the leakage current compensation circuit is coupled to a global word line select transistor disposed in the selected global word line path and configured to selectively form an electrical flow path between the selected global word line and the sense amplifier.

7. The memory device of claim 4, wherein the leakage current compensation circuit is connected to a discharge transistor, the discharge transistor connected to one end of the sense amplifier and configured to selectively discharge a charge of the selected local word line.

8. The memory device of claim 1 wherein the read/write circuit is configured to connect to a memory cell array comprising the plurality of memory cells through a plurality of bit lines.

9. A memory device comprising:
   a memory cell array comprising a plurality of memory cells arranged at points where a plurality of word lines and a plurality of bit lines intersect; and
   a leakage current compensation circuit connected to a selected word line path from a selected memory cell of the plurality of memory cells to a sense amplifier, and configured to compensate for a total leakage current generated by unselected memory cells connected to the selected word line in a read operation mode of the memory device,
   wherein the leakage current compensation circuit is electrically connected to the selected word line path in a precharge period in which a selected bit line connected to the selected memory cell from among the plurality of bit lines is precharged.

10. The memory device of claim 9, wherein the leakage current compensation circuit is configured to drive a current of a value obtained by multiplying a number of bit lines crossing the selected word line from among the plurality of bit lines by a second current value indicating a leakage current value flowing through each of the unselected memory cells in the selected word line path, to compensate for the total leakage current.

11. The memory device of claim 9, wherein each of the plurality of word lines comprises a global word line and a plurality of local word lines,
   wherein one end of the selected memory cell is connected to a selected local word line from among the plurality of local word lines that is connected to a selected global word line from among the plurality of word lines, and
   wherein the selected word line path comprises a selected local word line path representing an electrical path from the one end of the selected memory cell to the selected global word line, and a selected global word line path representing an electrical path from the selected global word line to the sense amplifier.

12. The memory device of claim 11, wherein the leakage current compensation circuit is coupled to a local word line select transistor disposed in the selected local word line path and configured to selectively form an electrical flow path between the selected local word line and the selected global word line.

13. The memory device of claim 12, wherein each of the plurality of bit lines comprises a global bit line and a plurality of local bit lines,
   wherein the local word line select transistor is turned on based on a local word line selection signal input to a gate of the local word line select transistor in a word line precharge period in which the selected local word line is precharged, and is connected to the leakage current compensation circuit in a bit line precharge period in which a selected local bit line from among the plurality of local bit lines is precharged.

14. The memory device of claim 9, wherein each of the plurality of memory cells
comprises a phase change material (PCM) that has a resistance value that changes according to a state of the phase change material.

15. A memory device comprising a plurality of tiles, wherein each of the plurality of tiles comprises:
    a memory cell array comprising a plurality of memory cells connected to intersections between a plurality of word lines and a plurality of bit lines;
    a sense amplifier configured to amplify a voltage difference value between a voltage of a selected word line of the plurality of word lines and a reference voltage, in a read operation mode of the memory device, the selected word line coupled to a selected memory cell of the plurality of memory cells;
    a discharge transistor connected to one end of the sense amplifier and configured to discharge a charge of the selected word line in the read operation mode of the memory device; and
    a leakage current compensation circuit coupled to the discharge transistor and configured to compensate for a first current value generated by off cells of the plurality of memory cells in the read operation mode of the memory device, the off cells connected to the selected word line.

16. The memory device of claim 15, wherein the leakage current compensation circuit is configured such that the current of the first current value flows through the discharge transistor.

17. The memory device of claim 16, wherein the leakage current compensation circuit comprises a current mirror including a transistor corresponding to the discharge transistor.

18. The memory device of claim 15, wherein the plurality of word lines comprise a plurality of local word lines connected to each of a plurality of global word lines,
    wherein the memory device further comprises a local word line selection signal control circuit configured to fully or partially turn on a local word line select transistor disposed on a selected local word line from among the plurality of local word lines, the selected local word line coupled to the selected memory cell.

19. The memory device of claim 15, further comprising a selection logic circuit configured to selectively form an electrical flow path between the selected word line path and the leakage current compensation circuit based on an address of the selected memory cell input from outside of the memory device in the read operation mode.

* * * * *